United States Patent
Nishibayashi et al.

(10) Patent No.: US 10,304,739 B2
(45) Date of Patent: May 28, 2019

(54) METHOD FOR MANUFACTURING SEMICONDUCTOR SUBSTRATE, SEMICONDUCTOR SUBSTRATE, METHOD FOR MANUFACTURING COMBINED SEMICONDUCTOR SUBSTRATE, COMBINED SEMICONDUCTOR SUBSTRATE, AND SEMICONDUCTOR-JOINED SUBSTRATE

(71) Applicant: SUMITOMO ELECTRIC INDUSTRIES, LTD., Osaka-shi, Osaka (JP)

(72) Inventors: Yoshiki Nishibayashi, Itami (JP); Kazuo Nakamae, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 4 days.

(21) Appl. No.: 15/541,532

(22) PCT Filed: Jan. 15, 2016

(86) PCT No.: PCT/JP2016/051094
§ 371 (c)(1),
(2) Date: Jul. 5, 2017

(87) PCT Pub. No.: WO2016/114382
PCT Pub. Date: Jul. 21, 2016

(65) Prior Publication Data
US 2017/0372965 A1 Dec. 28, 2017

(30) Foreign Application Priority Data
Jan. 16, 2015 (JP) .................. 2015-006903

(51) Int. Cl.
H01L 21/02 (2006.01)
H01L 21/78 (2006.01)
(Continued)

(52) U.S. Cl.
CPC .......... *H01L 21/7813* (2013.01); *C30B 25/18* (2013.01); *H01L 21/02* (2013.01);
(Continued)

(58) Field of Classification Search
CPC ..... H01L 21/7813; H01L 29/34; H01L 29/22; H01L 29/2003; H01L 29/1608;
(Continued)

(56) References Cited

U.S. PATENT DOCUMENTS 5,587,210 A 12/1996 Marchywka et al.
6,387,829 B1 * 5/2002 Usenko ............... H01L 21/2007
257/E21.122
(Continued)

FOREIGN PATENT DOCUMENTS

JP H06-234595 A 8/1994
JP 2001-077335 A 3/2001
(Continued)

*Primary Examiner* — Thinh T Nguyen
(74) *Attorney, Agent, or Firm* — Drinker Biddle & Reath LLP

(57) ABSTRACT

A method for manufacturing a semiconductor substrate according to the present invention includes preparing a seed substrate containing a semiconductor material, forming an ion implanted layer at a certain depth from a front surface of a main surface of the seed substrate by implanting ions into the seed substrate, growing a semiconductor layer on the main surface of the seed substrate with a vapor-phase synthesis method, and separating a semiconductor substrate including the semiconductor layer and a part of the seed (Continued)

substrate by irradiating the front surface of the main surface of at least any of the semiconductor layer and the seed substrate with light.

8 Claims, 8 Drawing Sheets

(51) Int. Cl.
    *C30B 25/18* (2006.01)
    *H01L 29/16* (2006.01)
    *H01L 29/20* (2006.01)
    *H01L 29/22* (2006.01)
    *H01L 29/34* (2006.01)
    *H01L 21/20* (2006.01)
    *H01L 21/268* (2006.01)

(52) U.S. Cl.
    CPC .... *H01L 21/02002* (2013.01); *H01L 21/0254* (2013.01); *H01L 21/0256* (2013.01); *H01L 21/0262* (2013.01); *H01L 21/02389* (2013.01); *H01L 21/02409* (2013.01); *H01L 21/02433* (2013.01); *H01L 21/02527* (2013.01); *H01L 21/02529* (2013.01); *H01L 21/02557* (2013.01); *H01L 21/02631* (2013.01); *H01L 21/02658* (2013.01); *H01L 21/2007* (2013.01); *H01L 21/268* (2013.01); *H01L 21/7806* (2013.01); *H01L 29/1602* (2013.01); *H01L 29/1608* (2013.01); *H01L 29/2003* (2013.01); *H01L 29/22* (2013.01); *H01L 29/34* (2013.01)

(58) Field of Classification Search
    CPC .......... H01L 29/1602; H01L 21/02658; H01L 21/0256; H01L 21/02557; H01L 21/02529; H01L 21/02527
    USPC .......... 438/105, 931, 152, 458, 455; 257/77, 257/532, E27.026
    See application file for complete search history.

(56) References Cited

U.S. PATENT DOCUMENTS

| | | | |
|---|---|---|---|
| 7,902,038 B2* | 3/2011 | Aspar | B81C 99/008 257/629 |
| 8,748,294 B2* | 6/2014 | Akiyama | H01L 21/76254 257/347 |
| 2003/0008437 A1* | 1/2003 | Inoue | H01L 21/6835 438/149 |
| 2005/0003641 A1 | 1/2005 | Faure | |
| 2005/0118349 A1 | 6/2005 | Whitehead et al. | |
| 2008/0113496 A1* | 5/2008 | Keller | C30B 25/02 438/481 |
| 2009/0117711 A1* | 5/2009 | Harle | H01L 21/76254 438/463 |
| 2012/0119323 A1* | 5/2012 | Akiyama | H01L 21/265 257/507 |
| 2012/0119336 A1* | 5/2012 | Akiyama | H01L 21/76254 257/629 |
| 2012/0280355 A1* | 11/2012 | Akiyama | H01L 21/76254 257/507 |
| 2014/0038392 A1 | 2/2014 | Yonehara et al. | |
| 2016/0118294 A1 | 4/2016 | Kobayashi et al. | |

FOREIGN PATENT DOCUMENTS

| | | |
|---|---|---|
| JP | 2007-112637 A | 5/2007 |
| JP | 2009-088497 A | 4/2009 |
| JP | 2010-509757 A | 3/2010 |
| JP | 2011-060860 A | 3/2011 |
| JP | 2011-060862 A | 3/2011 |
| JP | 2012-169363 A | 9/2012 |
| JP | 5455595 B2 | 3/2014 |
| WO | WO-2008/058131 A2 | 5/2008 |
| WO | WO-2014/207988 A1 | 12/2014 |

* cited by examiner

METHOD FOR MANUFACTURING SEMICONDUCTOR SUBSTRATE, SEMICONDUCTOR SUBSTRATE, METHOD FOR MANUFACTURING COMBINED SEMICONDUCTOR SUBSTRATE, COMBINED SEMICONDUCTOR SUBSTRATE, AND SEMICONDUCTOR-JOINED SUBSTRATE

TECHNICAL FIELD

The present invention relates to a method for manufacturing a semiconductor substrate, a semiconductor substrate, a method for manufacturing a combined semiconductor substrate, a combined semiconductor substrate, and a semiconductor-joined substrate.

BACKGROUND ART

A semiconductor substrate is contained in every piece of electronics and widely used. In particular, a wide band gap semiconductor substrate is a material expected as a semiconductor substrate for a high-efficiency device contributing to energy saving and a power device. Among others, a diamond substrate is widely used not only as a semiconductor substrate but also for various tools (cutting tools such as a drill, an end mill, a milling cutter, a cutter, and a cutting tool, dice, jet nozzles for water or other fluids, and wear resistant tools such as a stichel), optical components (a window and a lens), and materials for electronic components (a heat radiating substrate), and importance thereof will further increase in the future.

Most semiconductors can be formed into a thin film, in a plate shape, or in a bulk shape with a vapor-phase synthesis method (hereinafter also referred to as chemical vapor deposition (CVD)).

In the vapor-phase synthesis method, a semiconductor layer is grown on a seed substrate composed of a seed crystal. The semiconductor layer can be used together with the seed substrate. Alternatively, the semiconductor layer may be separated from the seed substrate and only the semiconductor layer can be used for a product. In this case, since the seed substrate can be used again, manufacturing cost can be reduced.

PTD 1 (Japanese Patent Laying-Open No. 6-234595) discloses a method of alternately stacking a first diamond layer high in light transmission property and a second diamond layer low in light transmission property with a vapor-phase synthesis method, irradiating the stack with laser beams to have the second diamond layer absorb the laser beams, and separating the first diamond layer as a diamond thin plate.

PTD 2 (Japanese Patent Laying-Open No. 2007-112637) discloses a method of growing a first diamond layer low in light transmission property and a second diamond layer high in light transmission property on a substrate with a vapor-phase synthesis method to thereby obtain a stack, irradiating an upper surface or a lower surface of the stack with laser beams to thereby alter the first diamond layer, and peeling the altered first diamond layer through such treatment as heat treatment, electrochemical etching, or acid etching to thereby separate the second diamond layer.

PTD 3 (U.S. Pat. No. 5,587,210) discloses a method of forming a damaged layer composed of non-diamond carbon in a substrate by implanting ions into a diamond substrate, thereafter growing diamond on the substrate with a vapor-phase synthesis method, thereafter electrochemically etching the damaged layer, and separating the grown diamond from the substrate.

In order to reduce manufacturing cost, it is also effective to thinly slice a seed substrate for use.

PTD 4 (Japanese Patent Laying-Open No. 2011-60860) discloses a method of forming a reformed layer in a substrate by irradiating a front surface of the substrate with laser beams, thereafter etching the reformed layer, and slicing the substrate.

PTD 5 (Japanese Patent Laying-Open No. 2012-169363) discloses a substrate processing method of forming a reformed layer in a substrate by irradiating a front surface of the substrate with laser beams and thereafter splitting the substrate at the reformed layer or in the vicinity of the reformed layer.

PTD 6 (Japanese Patent Laying-Open No. 2011-60862) discloses a substrate slicing method including forming a reformed layer in a substrate by irradiating a front surface of the substrate with laser beams, thereafter providing a groove in the reformed layer, and peeling the substrate with the groove being defined as a starting point.

CITATION LIST

Patent Document

PTD 1: Japanese Patent Laying-Open No. 6-234595
PTD 2: Japanese Patent Laying-Open No. 2007-112637
PTD 3: U.S. Pat. No. 5,587,210
PTD 4: Japanese Patent Laying-Open No. 2011-60860
PTD 5: Japanese Patent Laying-Open No. 2012-169363
PTD 6: Japanese Patent Laying-Open No. 2011-60862

SUMMARY OF INVENTION

Technical Problem

In the method in PTD 1, in order to sufficiently cleave with laser beams, the second diamond layer which absorbs laser beams, bond of diamond hardest among materials should be cut. For such cleavage, intensity of the laser beams should be maintained sufficiently high. At the front surface of the first diamond layer through which laser beams should basically pass, intensity of the laser beams may partially exceed a process threshold value under the influence by debris or irregularities at the front surface and the first diamond layer may also be processed. Since the second diamond layer is abruptly cleaved, a boundary of cleavage may reach also the first diamond layer on the momentum of cleavage and the separated front surface is roughened. Diamond as a whole may fracture due to impacts at the time of process.

Since an etched layer (which is hereinafter also referred to as a damaged layer) is very small in thickness in PTDs 2 to 4, a rate of permeation of an etchant into the damaged layer is very low. Therefore, with increase in size of a substrate, a rate of separation of diamond is very low and manufacturing cost will increase. A liquid may no longer permeate into the damaged layer and separation may fail.

In PTDs 5 and 6, since the substrate is peeled by applying physical force to the reformed layer, a front surface of the obtained substrate tends to be rough. When the substrate does not have a sufficient thickness relative to its size, the substrate will fracture.

A first object of the present invention is to provide a method for manufacturing a semiconductor substrate allowing separation of a semiconductor layer from a part of a seed substrate in a short period of time, allowing separation even when a seed substrate is small in thickness or large in size, and providing a flat separated surface, a semiconductor substrate obtained with the method for manufacturing a semiconductor substrate, and a semiconductor-joined substrate from which the semiconductor substrate can be separated.

A second object of the present invention is to provide a method for manufacturing a combined semiconductor substrate allowing slicing of a thin seed substrate in a short period of time and providing a flat sliced surface and a combined semiconductor substrate obtained with the method for manufacturing a combined semiconductor substrate.

Solution to Problem

A method for manufacturing a semiconductor substrate according to one manner of the present invention includes preparing a seed substrate containing a semiconductor material, forming an ion implanted layer (a layer where implanted ions remain) at a certain depth from a front surface of a main surface of the seed substrate by implanting ions into the seed substrate, growing a semiconductor layer on the main surface of the seed substrate with a vapor-phase synthesis method, and separating a semiconductor substrate including the semiconductor layer and a part of the seed substrate by irradiating the front surface of the main surface of at least any of the semiconductor layer and the seed substrate with light.

According to the present method, a state of bonding of a semiconductor element is not directly cut with light (such as laser beams), nor a reformed layer or an altered layer is formed in a semiconductor with light. Rather, bond of elements in a semiconductor is loosened by implanting ions, laser directly or indirectly applies energy to ions (atoms or molecules) which remain inside as a result of implantation, and expansion energy of the implanted ions (atoms or molecules) cuts bond of the semiconductor. Ion implantation is effective in that, in spite of high energy of each one atom, one atom is small and hence such energy is low relative to total energy. Though energy of one atom is sufficient for loosening or cutting bond of diamond, such energy is effectively much lower than energy which breaks the whole diamond. Principles of the present invention are that, under such circumstances, light applies energy to atoms which remain inside as a result of ion implantation so that the atoms evaporate and expand or the atoms simply evaporate to cut only a weakened portion (implantation interface). An object to separate a substrate and a grown semiconductor from each other with light energy much lower than in a conventional method in which cutting is performed only with light is achieved. With a method of directly cutting a state of bonding of a semiconductor element with light, force is isotropically applied to a semiconductor crystal at one spot of condensed laser. The force is applied not only in a desired direction of separation but also in a direction of fracture of a substrate, which may result in fracture of the substrate. When a portion where ions remain as a result of implantation is two-dimensionally formed in advance, however, a weak portion is two-dimensional. Then, even though light is condensed at one spot, a direction of fracture is not isotropic and force is applied in a direction of perpendicular tearing of an ion implanted surface as if there were a cut-off line. Even though light is condensed at one spot, separation can satisfactorily be achieved by scanning.

A semiconductor substrate according to one manner of the present invention is obtained with the method for manufacturing a semiconductor substrate described above.

A semiconductor substrate according to one manner of the present invention includes a semiconductor layer formed with a vapor-phase synthesis method. The semiconductor substrate includes a first main surface and a second main surface. The first main surface contains a first element different in type or state of bonding from a main element forming the semiconductor substrate. The first element includes at least one selected from the group consisting of hydrogen, oxygen, nitrogen, carbon, helium, neon, and argon. The first main surface has surface roughness smaller than 10 µM. The main element forming the semiconductor substrate refers to an element forming semiconductor lattices of the semiconductor substrate, the main element being contained by 1 atm % or more at an atomic ratio. The different state of bonding means the following. For carbon, $sp^3$ bond and $sp^2$ bond represent states of bonding different from each other. An example in which a metal is bonded to nitrogen is different from a state of bonding to oxygen and a state of bonding to a metal. Surface roughness refers to Ra defined under JIS B 0601-2013 and to an arithmetic average value of surface irregularities. This is also applicable to the description below. The first element is present, for example, in a plurality of substantially circular patterns in the first main surface.

A method for manufacturing a combined semiconductor substrate according to one manner of the present invention includes preparing a seed substrate containing a semiconductor material, forming an ion implanted layer at a certain depth from a front surface of a main surface of the seed substrate by implanting ions into the seed substrate, growing a semiconductor layer on the main surface of the seed substrate with a vapor-phase synthesis method, bonding a first substrate onto the semiconductor layer, and separating a combined semiconductor substrate including the first substrate, the semiconductor layer, and a part of the seed substrate by irradiating the front surface of the main surface of at least any of the first substrate and the seed substrate with light.

A method for manufacturing a combined semiconductor substrate according to one manner of the present invention includes preparing a seed substrate containing a semiconductor material, forming an ion implanted layer at a certain depth from a front surface of a main surface of the seed substrate by implanting ions into the seed substrate, bonding a first substrate onto the main surface of the seed substrate, and separating a combined semiconductor substrate including the first substrate and a part of the seed substrate by irradiating the front surface of the main surface of at least any of the first substrate and the seed substrate with light.

A combined semiconductor substrate according to one manner of the present invention is obtained with the method for manufacturing a combined semiconductor substrate described above.

A combined semiconductor substrate according to one manner of the present invention includes a first substrate and a semiconductor layer stacked on a main surface of the first substrate. A main surface of the combined semiconductor substrate of the semiconductor layer contains a first element different in type or state of bonding from a main element forming the semiconductor layer. The first element includes at least one selected from the group consisting of hydrogen, oxygen, nitrogen, carbon, helium, neon, and argon. The combined semiconductor substrate has surface roughness of the main surface of the semiconductor layer smaller than 10

μm. The semiconductor layer has a thickness not smaller than 0.1 μm and not greater than 50 The main element forming the semiconductor layer refers to an element forming semiconductor lattices of the semiconductor layer, the main element being contained by 1 atm % or more at an atomic ratio. The different state of bonding means the following. For carbon, $sp^3$ bond and $sp^2$ bond represent states of bonding different from each other. An example in which a metal is bonded to nitrogen is different from a state of bonding to oxygen and a state of bonding to a metal.

A semiconductor-joined substrate according to one manner of the present invention includes a seed substrate containing a semiconductor material and a semiconductor layer arranged on a main surface of the seed substrate. The seed substrate has an ion implanted layer containing a first element different in type or state of bonding from a main element forming the semiconductor material. The first element includes at least one selected from the group consisting of hydrogen, oxygen, nitrogen, carbon, helium, neon, and argon. The main element forming the semiconductor material refers to an element forming semiconductor lattices of the semiconductor material, the main element being contained by 1 atm % or more at an atomic ratio. The different state of bonding means the following. For carbon, $sp^3$ bond and $sp^2$ bond represent states of bonding different from each other. An example in which a metal is bonded to nitrogen is different from a state of bonding to oxygen and a state of bonding to a metal.

Advantageous Effects of Invention

According to the manner, a method for manufacturing a semiconductor substrate allowing separation of a semiconductor layer from a part of a seed substrate in a short period of time, allowing separation even when a seed substrate is small in thickness or large in size, and providing a flat separated surface and a semiconductor substrate obtained with the method for manufacturing a semiconductor substrate can be provided. Since there is no thermal or electrical restriction, a degree of freedom in separation such as separation at a room temperature is also high and extensive applications are available. For example, such applications as separation after soldering with an AuSn base, an Sn base, or an In base are available.

According to the manner, a method for manufacturing a combined semiconductor substrate allowing slicing of a thin seed substrate in a short period of time and providing a flat sliced surface and a combined semiconductor substrate obtained with the method of manufacturing a combined semiconductor substrate can be provided. With a separation method based on principles of cutting of atomic bond of a semiconductor with common laser, energy should be concentrated to an extremely small area for cutting bond while fracture is prevented. According to the present invention, bond can be cut without concern about fracture owing to irradiation of a large area. When an area of single irradiation is large, a time period for irradiation with scanning light (such as laser beams) can be shortened.

DESCRIPTION OF EMBODIMENTS

Figure 1:
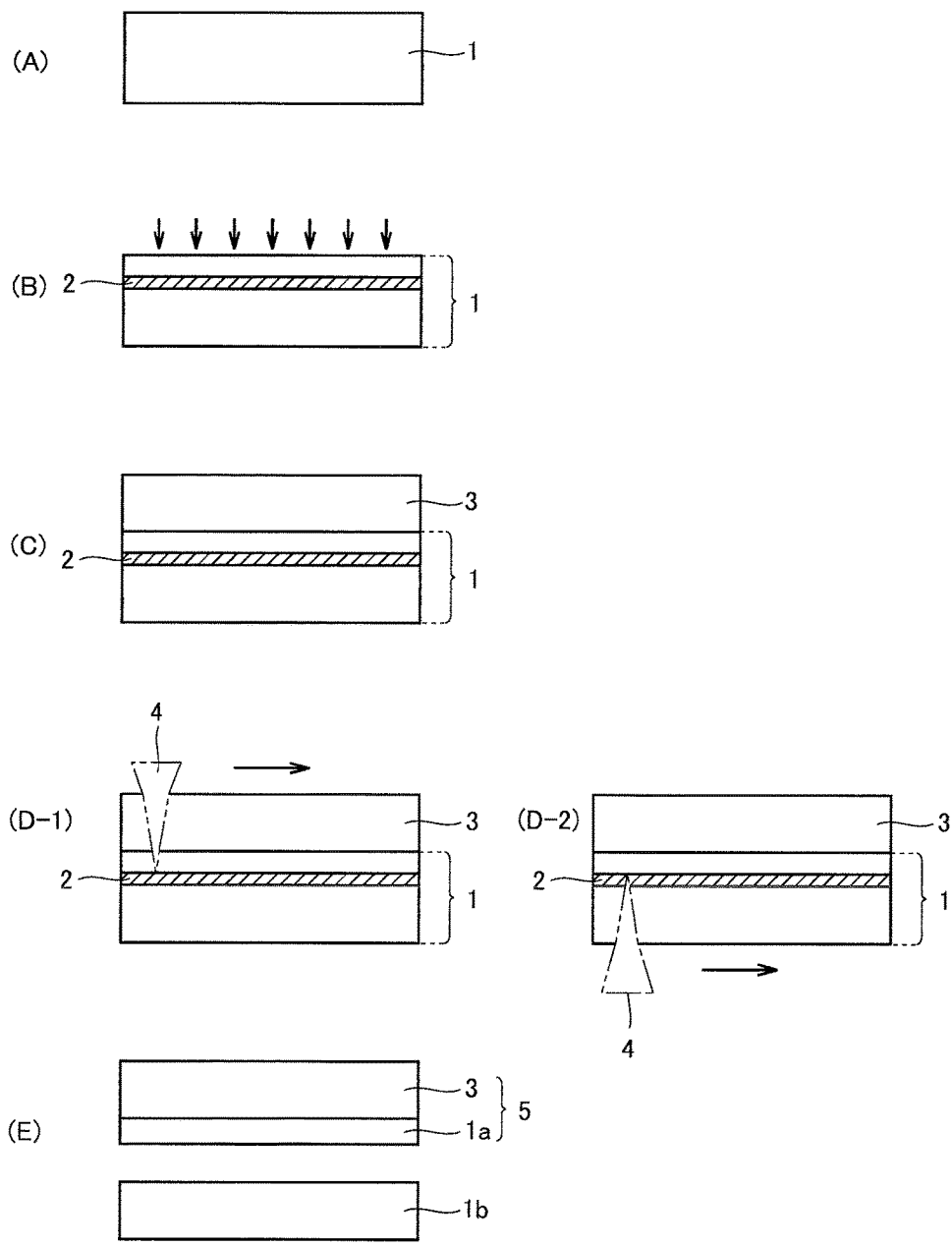
FIG. 1 (A) to (E) is a diagram schematically showing a method for manufacturing a semiconductor substrate according to one manner of the present invention.

Description of Embodiments of the Present Invention

Embodiments of the present invention will initially be listed and described.

A method for manufacturing a semiconductor substrate according to one manner of the present invention is (1) a method for manufacturing a semiconductor substrate including preparing a seed substrate containing a semiconductor material, forming an ion implanted layer (a layer where implanted ions remain) at a certain depth from a front surface of a main surface of the seed substrate by implanting ions into the seed substrate, and separating a semiconductor substrate including a part of the seed substrate by irradiating the front surface of the main surface of the seed substrate with light or (2) a method for manufacturing a semiconductor substrate including preparing a seed substrate containing a semiconductor material, forming an ion implanted layer (a layer where implanted ions remain) at a certain depth from a front surface of a main surface of the seed substrate by implanting ions into the seed substrate, growing a semiconductor layer on the main surface of the seed substrate with a vapor-phase synthesis method, and separating a semiconductor substrate including the semiconductor layer and a part of the seed substrate by irradiating the front surface of the main surface of at least any of the semiconductor layer and the seed substrate with light.

The ion implanted layer does not necessarily have to be a highly light absorptive layer. In an example of a semiconductor containing carbon such as diamond, when specific ions are implanted at a specific concentration or higher, bond of carbon is cut, $sp^2$ bond of carbon increases, a color tends to be black, and a light absorptive layer may be formed. When ions are implanted at a concentration lower than a specific concentration or when bond of carbon can be terminated even though specific ions (mainly hydrogen ions) are implanted, however, a light absorption coefficient often does not become high. For a semiconductor other than diamond, when there is no $sp^2$ bond of carbon produced, a light absorption coefficient may hardly increase even though a concentration is equal to or higher than a specific concentration. Without a light absorption coefficient becoming high, however, bond of an element shaping a substrate is cut or loosened. Therefore, by applying energy to lattices in the surroundings through irradiation with laser or directly applying energy to implanted ions, energy is applied to ions or molecules which will finally expand, and the ions or molecules vaporize and expand. Thus, sufficient strength for separation of a substrate is obtained.

According to the manner, a semiconductor substrate can be separated from a part of a seed substrate in a short period of time. Even though a seed substrate is small in thickness or large in size, the semiconductor substrate can be separated from a part of the seed substrate. A semiconductor substrate of which separated surface is flat can be obtained.

In the manner, an ion implanted layer lower in crystallinity than a seed substrate is formed in the seed substrate through ion implantation. An ion implanted layer low in bonding strength is formed in advance in the seed substrate. Thus, light emitted through a front surface of the main surface of the seed substrate or the main surface of at least any of the semiconductor layer and the seed substrate is absorbed by the ion implanted layer or the vicinity thereof. Energy of absorbed light gasifies and expands ions (atoms or molecules) present in the ion implanted layer, presses to spread a portion of the ion implanted layer in which bond has been weakened, and a semiconductor substrate including a part of the seed substrate or a semiconductor substrate including the semiconductor layer and a part of the seed substrate is separated. The method for manufacturing a semiconductor substrate according to the manner can separate the semiconductor substrate by irradiation with light (including laser beams), without using such a function as direct alteration or cleavage of a semiconductor which forms a seed substrate. Therefore, a semiconductor substrate can be separated in a short period of time because irradiation lower in power and greater in area (beam size) than in direct cleavage of the semiconductor forming the seed substrate by irradiation with light can be performed.

According to the manner, instead of a method of directly cutting secure bond of a semiconductor element, irradiation light is emitted to the ion implanted layer or the vicinity thereof, energy thereof is applied to the implanted layer or the vicinity thereof to vaporize an implanted element present in the implanted layer, and upper and lower surfaces of the ion implanted layer are pressed and spread with a gas pressure. The semiconductor substrate can thus be separated from a most part of the seed substrate with very low power.

According to the manner, a semiconductor substrate can be separated at a room temperature. Even when a temperature necessary for gasifying an implanted element is equal to or higher than a temperature for melting a semiconductor, energy of irradiation light is applied to a local implanted element to merely generate a desired gas pressure. Therefore, it is not necessary to expose the whole semiconductor substrate to a high temperature. Therefore, a semiconductor forming a seed substrate or a semiconductor layer is hardly affected by melting and alteration by heat, desorption or reconstruction of surface atoms, and diffusion of doping atoms. Energy of irradiation light is not applied to a crystalline portion in which defects have not been introduced but to a surface where defects have been introduced through ion implantation (the ion implanted layer, that is, a layer where implanted ions remain). Therefore, cracks are hardly generated in a location other than the ion implanted layer. Peel-off readily proceeds in the ion implanted layer as if tearing along perforations were performed.

A semiconductor substrate can be separated with a temperature being increased to a desired temperature. In this case, restriction in terms of a temperature, restriction in terms of an amount of implantation of ions, restriction in terms of time, and restriction in terms of apparatuses can be selected and set from among a range of conditions much wider than those under a conventional separation technique.

According to the manner, irradiation light should only act on an element introduced during implantation of ions into the seed substrate, the ion implanted layer, or the vicinity thereof. Therefore, irradiation light lower in power than light used for conventional direct cleavage of bond of semiconductor atoms can be employed.

(3) Preferably, the ion implanted layer has a thickness not smaller than 50 nm and not greater than 10 μm and a dose of ions is within a range not less than $1\times10^{14}$ cm$^{-2}$ and not more than $2\times10^{18}$ cm$^{-2}$. Thus, a time period for separating the semiconductor substrate from a part of the seed substrate can be shortened.

(4) Preferably, ions including at least one element selected from the group consisting of hydrogen, oxygen, nitrogen, carbon, helium, neon, and argon are implanted. These ions are readily gasified when they indirectly or directly absorb light energy. Therefore, since irradiation energy of light can efficiently be used, a time period for separating the semiconductor substrate from a part of the seed substrate can be shortened. Preferably, ions including at least one type of molecules selected from the group consisting of hydrogen molecules, oxygen molecules, and nitrogen molecules are employed. These molecule ions are more likely to be gasified than atoms alone when they indirectly or directly absorb light energy. Therefore, since irradiation energy of light can efficiently be used, a time period for separating the semiconductor substrate from a part of the seed substrate can be shortened.

(5) Preferably, the light is pulsed light, and irradiation fluence per pulse at the front surface of the main surface irradiated with the light is not lower than 0.01 J/mm$^2$ and not higher than 1500 J/mm$^2$. Thus, light can destroy only the ion implanted layer, without destroying the front surface of the main surface of the semiconductor layer and the seed substrate or generating cracks in the seed substrate and the semiconductor layer.

(6) Preferably, the light is pulsed light, and pulse energy at the front surface of the main surface irradiated with the light is not lower than 0.05 mJ and not higher than 1000 mJ. Thus, light can destroy only the ion implanted layer without destroying the front surface of the main surface irradiated with light or generating cracks in the seed substrate and the semiconductor layer if there is a semiconductor layer.

(7) Preferably, the light is laser beams, and scans the front surface of the main surface irradiated with the light. With laser beams, intense light can be generated in one pulse and intensity of one pulse or a pulse width can readily be controlled. Light is also readily condensed or spread and power density can be adjusted. A wavelength of laser beams can be selected, and a wavelength which is less likely to be absorbed by a highly crystalline semiconductor but is likely to be absorbed by a less crystalline ion implanted layer or defects can also be selected.

(8) Preferably, the separating a semiconductor substrate is performed in a liquid. Thus, impacts applied to the seed substrate and the semiconductor layer if there is a semiconductor layer due to irradiation with light can be mitigated, and hence generation of cracks or fracture in the seed substrate or the semiconductor layer can be suppressed.

(9) Preferably, the semiconductor layer contains at least one selected from the group consisting of diamond, aluminum nitride, gallium nitride, silicon carbide, zinc selenide, and zinc sulfide. The semiconductor layer containing such a semiconductor can suitably be employed as a material for a semiconductor device. The semiconductor material may be polycrystalline or may be used for optical applications.

(10) A semiconductor substrate according to one manner of the present invention is a semiconductor obtained with the method for manufacturing a semiconductor substrate described in (1) to (9) above. The semiconductor substrate achieves reduction in manufacturing cost because a time period for separation thereof from a part of the seed substrate is shortened.

(11) A semiconductor substrate according to one manner of the present invention includes a semiconductor layer formed with a vapor-phase synthesis method. The semiconductor substrate includes a first main surface and a second main surface. The first main surface contains a first element different in type or state of bonding from a main element forming the semiconductor substrate. The first element includes at least one selected from the group consisting of hydrogen, oxygen, nitrogen, carbon, helium, neon, and argon. The first main surface has surface roughness smaller than 10 μm. The semiconductor substrate has a flat front surface and is readily processed for various applications. The main element forming the semiconductor substrate refers to an element forming semiconductor lattices of the semiconductor substrate, the main element being contained by 1 atm % or more at an atomic ratio. The different state of bonding means the following. For carbon, $sp^3$ bond and $sp^2$ bond represent states of bonding different from each other. An example in which a metal is bonded to nitrogen is different from a state of bonding to oxygen and a state of bonding to a metal. An element forming semiconductor lattices of the semiconductor substrate is bonded to another element forming the semiconductor lattices. Presence of an element forming semiconductor lattices of the semiconductor substrate in a state of bonding different from a state of bonding in the semiconductor lattices in the first main surface includes an example in which the element is not bonded to another element forming the semiconductor lattices and an example in which the element is bonded to an element different from the element forming the semiconductor lattices. A type of an element can be analyzed with secondary ion mass spectrometry (SIMS), X-ray photoelectron spectroscopy (XPS), Auger electron spectroscopy (AES), energy dispersive X-ray analysis (EDX), electron probe microanalysis (SPMA), and the like. An element or a state of bonding can be analyzed with X-ray photoelectron spectroscopy (XPS), Auger electron spectroscopy (AES), and the like. A state of bonding of an element can be analyzed with X-ray photoelectron spectroscopy (XPS), Auger electron spectroscopy (AES), and the like.

(12) The first element may be present in a plurality of substantially circular patterns in the first main surface. Such an example includes also an example in which the first element is in the substantially circular patterns as if the first element were present to form a plurality of substantially circular recesses in the first main surface. A pattern formed by an element can be analyzed by mapping with X-ray photoelectron spectroscopy (XPS), Auger electron spectroscopy (AES), and the like.

(13) A method for manufacturing a combined semiconductor substrate according to one manner of the present invention includes preparing a seed substrate containing a semiconductor material, forming an ion implanted layer at a certain depth from a front surface of a main surface of the seed substrate by implanting ions into the seed substrate, growing a semiconductor layer on the main surface of the seed substrate with a vapor-phase synthesis method, bonding a first substrate onto the semiconductor layer, and separating a combined semiconductor substrate including the first substrate, the semiconductor layer, and a part of the seed substrate by irradiating the front surface of the main surface of at least any of the first substrate and the seed substrate with light.

According to the manner, the seed substrate can thinly be sliced in a short period of time. Even when a seed substrate is small in thickness or large in size, the seed substrate can thinly be sliced. A combined semiconductor substrate of which sliced surface is flat can be obtained.

(14) A method for manufacturing a combined semiconductor substrate according to one manner of the present invention includes preparing a seed substrate containing a semiconductor material, forming an ion implanted layer at a certain depth from a front surface of a main surface of the seed substrate by implanting ions into the seed substrate, bonding a first substrate onto the main surface of the seed substrate, and separating a combined semiconductor substrate including the first substrate and a part of the seed substrate by irradiating the front surface of the main surface of at least any of the first substrate and the seed substrate with light.

According to the manner, the seed substrate can thinly be sliced in a short period of time. Even when a seed substrate is small in thickness or large in size, the seed substrate can thinly be sliced. A combined semiconductor substrate of which sliced surface is flat can be obtained.

(15) A combined semiconductor substrate according to one manner of the present invention is obtained with the method for manufacturing a combined semiconductor substrate described in (13) or (14) above. The combined semiconductor substrate achieves reduction in manufacturing cost because a time period for separation thereof from a part of the seed substrate is shortened.

(16) A combined semiconductor substrate according to one manner of the present invention includes a first substrate and a semiconductor layer stacked on a main surface of the first substrate. A main surface of the combined semiconductor substrate on a side of the semiconductor layer contains a first element different in type or state of bonding from a main element forming the semiconductor layer. The first element includes at least one selected from the group consisting of hydrogen, oxygen, nitrogen, carbon, helium, neon, and argon. The combined semiconductor substrate has surface roughness of the main surface on the side of the semiconductor layer smaller than 10 μm. The semiconductor layer has a thickness not smaller than 0.1 μm and not greater than 50 μm. The combined semiconductor substrate has a flat front surface and is readily processed for various applications. The main element forming the semiconductor layer refers to an element forming semiconductor lattices of the semiconductor layer, the main element being contained by 1 atm % or more at an atomic ratio. The different state of bonding means the following. For carbon, $sp^3$ bond and $sp^2$ bond represent states of bonding different from each other. An example in which a metal is bonded to nitrogen is different from a state of bonding to oxygen and a state of bonding to a metal. An element forming semiconductor lattices of the semiconductor layer is bonded to another element forming the semiconductor lattices. Presence of an element forming the semiconductor lattices of the semiconductor layer in a state of bonding different from a state of bonding in the semiconductor lattices in the first main surface includes an example in which the element is not bonded to another element forming the semiconductor lattices and an example in which the element is bonded to an element different from the element forming the semiconductor lattices. A type of an element can be analyzed with secondary ion mass spectrometry (SIMS), X-ray photoelectron spectroscopy (XPS), Auger electron spectroscopy (AES), energy dispersive X-ray analysis (EDX), electron probe microanalysis (EPMA), and the like. A state of bonding of an element can be analyzed with X-ray photoelectron spectroscopy (XPS), Auger electron spectroscopy (AES), and the like.

(17) The first element may be present in a plurality of substantially circular patterns in the main surface on the side of the semiconductor layer. A pattern formed by an element can be analyzed by mapping with X-ray photoelectron spectroscopy (XPS), Auger electron spectroscopy (AES), and the like.

(18) A semiconductor-joined substrate according to one manner of the present invention includes a seed substrate containing a semiconductor material and a semiconductor layer arranged on a main surface of the seed substrate. The seed substrate has an ion implanted layer containing a first element different in type or state of bonding from a main element forming the semiconductor material. The first element includes at least one selected from the group consisting of hydrogen, oxygen, nitrogen, carbon, helium, neon, and argon. The main element forming the semiconductor material refers to an element forming semiconductor lattices of the semiconductor material, the main element being contained by 1 atm % or more at an atomic ratio. The different state of bonding means the following. For carbon, $sp^3$ bond and $sp^2$ bond represent states of bonding different from each other. An example in which a metal is bonded to nitrogen is different from a state of bonding to oxygen and a state of bonding to a metal. An element forming semiconductor lattices of the semiconductor material is bonded to another element forming the semiconductor lattices. Presence of an element forming the semiconductor lattices of the semiconductor material in a state of bonding different from a state of bonding in the semiconductor lattices in the ion implanted layer includes an example in which the element is not bonded to another element forming the semiconductor lattices and an example in which the element is bonded to an element different from the element forming the semiconductor lattices. A type of an element can be analyzed with secondary ion mass spectrometry (SIMS), X-ray photoelectron spectroscopy (XPS), Auger electron spectroscopy (AES), energy dispersive X-ray analysis (EDX), electron probe microanalysis (EPMA), and the like. A state of bonding of an element can be analyzed with X-ray photoelectron spectroscopy (XPS), Auger electron spectroscopy (AES), and the like.

Details of Embodiments of the Present Invention

A specific example of a method for manufacturing a semiconductor substrate and a semiconductor substrate according to embodiments of the present invention will be described below with reference to the drawings. The present invention is not limited to such exemplifications but is defined by the terms of the patent claims and is intended to include any modifications within the scope and meaning equivalent to the terms of the patent claims.

First Embodiment

<Method for Manufacturing Semiconductor Substrate>

Figure 2:
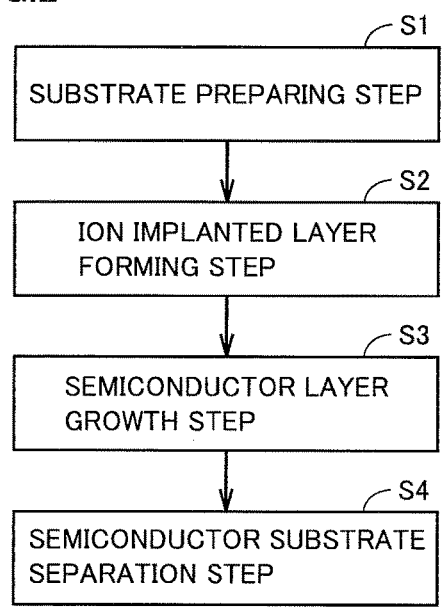
FIG. 2 is a flowchart showing the method for manufacturing a semiconductor substrate according to one manner of the present invention.

FIG. 1 (A) to (E) is a diagram schematically showing a method for manufacturing a semiconductor substrate according to an embodiment of the present invention. FIG. 2 is a flowchart showing the method for manufacturing a semiconductor substrate according to the embodiment of the present invention.

The method for manufacturing a semiconductor substrate according to the embodiment of the present invention includes preparing a seed substrate containing a semiconductor material (shown in FIG. 1 (A) and as a substrate preparing step (S1) in FIG. 2), forming an ion implanted layer at a certain depth from a front surface of a main surface of the seed substrate by implanting ions into the seed substrate (shown in FIG. 1 (B) and as an ion implanted layer forming step (S2) in FIG. 2), growing a semiconductor layer on the main surface of the seed substrate with a vapor-phase synthesis method (shown in FIG. 1 (C) and as a semiconductor layer growth step (S3) in FIG. 2), and separating a semiconductor substrate including the semiconductor layer and a part of the seed substrate by irradiating the front surface of the main surface of at least any of the semiconductor layer and the seed substrate with light (shown in FIG. 1 (D-1), (D-2), and (E) and as a semiconductor separation step (S4) in FIG. 2).

(Seed Substrate Preparing Step)

Initially, referring to FIG. 1 (A), a seed substrate 1 containing a semiconductor material is prepared.

Seed substrate 1 may be a single-crystal semiconductor substrate or a polycrystalline semiconductor substrate. In general, a single-crystal material is more expensive, and from a point of view of more exhibition of an effect of the embodiment of the present invention, a single-crystal semiconductor substrate is preferred. A semiconductor device is often of a single crystal.

A wide band gap semiconductor such as diamond, aluminum nitride, aluminum oxide, magnesium oxide, gallium nitride, gallium oxide, silicon carbide, zinc selenide, and zinc sulfide or a semiconductor such as gallium arsenide, indium phosphide, and silicon can be employed as a semiconductor material to be contained in seed substrate 1. These semiconductor materials can suitably be used for various semiconductor devices.

Seed substrate 1 is preferably highly crystalline. With seed substrate 1 high in crystallinity, a semiconductor layer 3 formed on seed substrate 1 can also highly be crystalline. Seed substrate 1 is preferably manufactured with a method capable of synthesizing a highly crystalline semiconductor. If diamond is employed, it is preferably composed of a single crystal manufactured with a high-temperature high-pressure synthesis method. If silicon carbide is employed, a sublimation method is preferred. If silicon is employed, silicon is preferably manufactured with a Czochralski method. Preferably, aluminum nitride is manufactured with a sublimation method, aluminum oxide is manufactured with a flux method or a Czochralski method, magnesium oxide is manufactured with a flux method, gallium nitride is manufactured with vapor phase epitaxy or a flux method, gallium oxide is manufactured with a melt growth method, zinc selenide is manufactured with a sublimation method or a chemical transport method in which iodine is employed as a transport agent, zinc sulfide is manufactured with a sublimation method, gallium arsenide and indium phosphide are manufactured with a vertical Bridgman method. A single-crystal semiconductor manufactured with a vapor-phase synthesis method may be acceptable. A product resulting from process of the semiconductor substrate obtained with the method for manufacturing a semiconductor substrate according to the embodiment of the present invention may be acceptable.

In order to efficiently form semiconductor layer 3 to a large thickness (a vertical direction in FIG. 1 (C)), a main surface of seed substrate 1 preferably has a specific plane orientation. For example, for silicon or diamond, a (001) plane is preferred. For silicon carbide or gallium nitride, a c plane is preferred. For zinc selenide or zinc sulfide, a (111) plane is preferred. In order to enhance homogeneity of crystals of semiconductor layer 3, the main surface of seed substrate 1 is angled off relative to a specific plane orientation by an angle preferably not smaller than 0° and not greater than 15° and more preferably not smaller than 1.5° and not greater than 10°.

Seed substrate 1 has a thickness preferably not smaller than 10 μm and not greater than 1000 μm and further preferably not smaller than 100 μm and not greater than 800 μm. A thickness of seed substrate 1 is measured in the vicinity of the center of the main surface of seed substrate 1.

Though seed substrate 1 is formed from one type of substrate in FIG. 1, seed substrate 1 may be structured such that a semiconductor layer containing a seed crystal is joined (bonded) onto a non-semiconductor substrate without a subsequent process being affected. Thus, even when a semiconductor layer containing a seed crystal is thin, fracture can be prevented and handleability is improved.

Though a shape of the main surface of seed substrate 1 is not particularly limited, the shape may be, for example, quadrangular, polygonal, and circular (including also orientation flat). A front surface of the main surface of seed substrate 1 may be a plane or a surface having irregularities in a form of a concave lens, a convex lens, a rectangle, a trapezoid, a pyramid, and the like.

(Ion Implanted Layer Forming Step)

Referring now to FIG. 1 (B), by implanting ions into seed substrate 1 (an arrow pointing to a downward direction in the figure), an ion implanted layer 2 is formed at a certain depth from the front surface of the main surface of seed substrate 1. In ion implantation, atoms different from semiconductor atoms forming the seed substrate or defects are introduced in seed substrate 1, or bond between semiconductor atoms is loosened. Since different atoms or defects enter seed substrate 1 in ion implantation, the front surface of seed substrate 1 maintains a crystal structure of the semiconductor. Therefore, after a layer is formed through ion implantation, a semiconductor layer can be formed on seed substrate 1.

A depth from the front surface of the substrate, of formed ion implanted layer 2 or a thickness thereof can be adjusted based on a type of mainly used ions, implantation energy, and an amount of irradiation. Design of ion implanted layer 2 can be calculated and expected substantially accurately through Monte Carlo simulation such as TRIM.

Implantation energy is preferably not lower than 50 keV and not higher than 10000 keV and further preferably not lower than 80 keV and not higher than 800 keV. An amount of irradiation is preferably not less than $1 \times 10^{14}/cm^2$ and not more than $2 \times 10^{18}/cm^2$ and further preferably not less than $1 \times 10^{15}/cm^2$ and not more than $8 \times 10^{17}/cm^2$. When implantation energy and the amount of irradiation are within these ranges, a crystal structure in the inside of seed substrate 1 can be destroyed and ion implanted layer 2 in which bonding strength between semiconductor atoms has been lowered can be formed while crystallinity of the main surface of seed substrate 1 is maintained to such an extent as allowing epitaxial growth with the vapor-phase synthesis method.

When implantation energy is as high as 50 keV or more, atomic vacancies are created in ion implanted layer 2 and bonding strength between atoms forming the semiconductor becomes low. Portions where bonding strength between atoms is low are disposed on the same plane in ion implanted layer 2. Therefore, when light is emitted from the outside so that introduced atoms absorb energy and vaporize and expand, force is equally applied to the portions in ion implanted layer 2. Therefore, a separation surface which is a destruction surface resulting from destruction of ion implanted layer 2 becomes flat. As ion implanted layer 2 is smaller in thickness or an amount of atomic vacancies is greater, flatness is preferably higher. When an amount of ions in ion implanted layer 2 is excessively small, peeling force is less likely to be obtained.

When an amount of irradiation is excessively large, a crystal structure of a semiconductor at an outermost surface is destroyed and semiconductor layer 3 may not be synthesized on the front surface of seed substrate 1 into which implantation has been performed. Even though semiconductor layer 3 could be synthesized, ion implanted layer 2 may partially disappear as being affected by an atmosphere at the time of synthesis and separation may become difficult. When implantation energy is excessively high, ion implanted layer 2 becomes too thick and it becomes difficult to obtain a flat separation plane. When an amount of irradiation is too small, it becomes difficult to separate a semiconductor substrate through irradiation with light which is performed in a subsequent step.

Ion implanted layer 2 formed in seed substrate 1 is preferably different in absorptance of irradiation light from seed substrate 1. Thus, the semiconductor layer can be separated from a part of the seed substrate in a shorter period of time. Even though ion implanted layer 2 and seed substrate 1 are equal to each other in absorptance of light, the semiconductor layer can be separated from a part of the seed substrate. This is because, instead of direct cutting of bond of the semiconductor substrate with light, energy is applied locally to lattices of the semiconductor crystals or implanted ions to transfer energy to implanted atoms or implanted molecules, so that atoms or molecules expand, which acts onto and cuts bond weakened by implantation.

Ion implanted layer 2 is preferably lower in light transmittance by at least 1% than seed substrate 1, because irradiation light is efficiently absorbed in ion implanted layer 2. Ion implanted layer 2 is lower in light transmittance further preferably by at least 5% and further preferably by at least 20% than seed substrate 1. Even when a light transmittance of ion implanted layer 2 is equal to or higher than the light transmittance of seed substrate 1, the semiconductor layer can be separated from a part of the seed substrate in a short period of time by adjusting a condition of irradiation with light. A light transmittance Ta is expressed in an expression (1) below, in consideration of multiple internal reflection.

$$Ta = I_t/I_o \qquad \text{Expression (1)}$$

A reflectance Ra in consideration of multiple reflection and single reflection R are expressed in expressions (2) and (3) below, respectively.

$$Ra = I_r/I_o \qquad \text{Expression (2)}$$

$$R = (n_0 - n_f)^2/(n_0 + n_f)^2 \qquad \text{Expression (3)}$$

(In the expression (1), $I_o$ represents intensity of incident light, $I_t$ represents intensity of emitted light after the light passes through a medium, $I_r$ represents intensity of reflected light after a medium in inserted, $n_0$ represents an index of refraction of air, and $n_f$ represents an index of refraction of diamond.)

When energy of irradiation light is higher than a band gap of a semiconductor, such difference of light transmittance is imperceptibly small. Since absorption by the semiconductor itself is great, the difference is imperceptibly small. When the ion implanted layer is irradiated with light, the light should pass through the semiconductor substrate and reach the ion implanted layer. In this case, light is desirably not absorbed in the semiconductor substrate. Therefore, in the present embodiment, light having energy lower than the band gap of the semiconductor is generally and effectively used.

A light transmittance can be measured with a common spectrophotometer. A transmittance of ion implanted layer 2 is expressed as a value compared with that of seed substrate 1 high in light transmission property, and it is measured as a value with a reflectance being inclusive without the reflectance being subtracted. Therefore, since the ion implanted layer having a 100% light transmission property has a reflectance not lower than a value calculated as an index of refraction of a semiconductor, a practical transmittance thereof does not exceed a transmittance calculated by subtracting the reflectance. Since the ion implanted layer has a very small thickness, variation in light transmittance even by 1% will lead to a great difference in absorption coefficient and brings about a significant effect. According to the present invention, however, the ion implanted layer is too small in thickness or does not form a clear level of absorption, and influence of absorption on a transmittance may hardly be observed. According to the present invention, even in such a case, the effect is exhibited so long as atomic bond in the crystal is cut by ions.

At a wavelength of irradiation light employed in a subsequent step of separating semiconductor layer 3, an absorption coefficient of ion implanted layer 2 is preferably at least 5 times and more preferably at least 30 times as large as an absorption coefficient of seed substrate 1. A light absorption coefficient is expressed in an expression (4) below in consideration of multiple internal reflection:

$$\mu = (\log_e((I_t/I_o)/((I_r/I_o)/R-1)))/x \qquad \text{Expression (4)}$$

(where $\mu$ represents an average light absorption coefficient, $I_o$ represents intensity of incident light, $I_t$ represents intensity of emitted light after the light passes through a medium, $I_r$ represents intensity of reflected light after a medium is inserted, R represents single reflection R expressed in the expression (3), and x represents a thickness of the medium (an effective thickness of ion implanted layer 2)).

When a light source including mixed wavelengths is employed as a light source, a transmittance and a coefficient of absorption of light mean a transmittance and a coefficient of light having a wavelength exhibiting maximal absorption energy at a wavelength within a wavelength range included in the light source.

When relation of the transmittance or the light absorption coefficient between seed substrate 1 and ion implanted layer 2 is within the aforementioned range, light passes through seed substrate 1 and is efficiently absorbed in ion implanted layer 2 when seed substrate 1 is irradiated with light. Therefore, a time period required for destruction of ion implanted layer 2 can be shortened. When a light transmittance of ion implanted layer 2 becomes higher, efficiency in absorption of light energy becomes higher, which is convenient for shortening a time period required for destruction of ion implanted layer 2, however, it is not essential. Ion implantation mainly aims at lowering in bonding strength between atoms which will be described next. In this case, light is desirably non-linearly absorbed in crystal lattices or ions themselves. In this case, it is important to expand implanted atoms and cut portions weak in bond with force resulting from expansion without directly cutting bond between crystal lattices. Therefore, a light transmittance may be lowered by the time of the step of separation with light, for example, by performing thermal annealing after ion implantation. A wavelength of light different from a wavelength of absorbed light may be used. Energy may indirectly be transferred to implanted ions so as to finally expand the implanted ions and apply energy for separation.

Ions of elements which can lower crystallinity of ion implanted layer 2 may be employed as ions to be implanted. For example, ions of all elements of which ions can be implanted, such as carbon, boron, nitrogen, oxygen, phosphorus, neon, hydrogen, helium, aluminum, silicon, sulfur, and argon, can be employed. Among these, at least one selected from the group consisting of hydrogen ions, hydrogen molecule ions, oxygen ions, oxygen molecule ions, nitrogen ions, nitrogen molecule ions, helium ions, neon ions, and argon ions is preferably used. These ions tend to be gasified by energy of light. Therefore, when the ion implanted layer contains these ions, these ions are gasified and expand when light is absorbed in ion implanted layer 2 or the vicinity thereof and hence destruction of the ion implanted layer having weak interatomic bond is promoted.

These ions are further preferably inert gas ions which do not bond to a semiconductor or hydrogen ions which may bond to a semiconductor but will not be incorporated in a matrix, for ease in separation of the semiconductor.

Boron, nitrogen, silicon, and phosphorus are not efficient because energy equivalent to cutting of bond between semiconductor atoms is required when such an element forms 4-coordination bond to atoms in a semiconductor. Aggregated nitrogen which does not form 4-coordination tends to be gasified, and it is effective. Substitution with atoms in a matrix can be calculated by comparing an amount of electron spin resonance (ESR) detected based on a substitution type with an amount of total nitrogen with secondary ion mass spectrometry (SIMS).

Ion implanted layer 2 is preferably formed at a depth from the main surface of seed substrate 1 preferably not smaller than 0.05 μm and not greater than 10 μm and further preferably not smaller than 0.1 μm and not greater than 1 μm. Thus, a thickness of the layer destroyed by irradiation light is sufficiently small and failure in separation can be prevented. The main surface of seed substrate 1 refers to a surface into which ions are implanted. A depth from the main surface of seed substrate 1 means a distance between the main surface of seed substrate 1 and the center of ion implanted layer 2 closest to the main surface of seed substrate 1 (a position where a concentration of implanted ions is highest).

Ion implanted layer 2 has a thickness preferably not smaller than 50 nm and not greater than 10 μm and further preferably not smaller than 100 nm and not greater than 1 μm. Thus, a layer destroyed by irradiation light (a layer necessary for separation) has a sufficiently small thickness and sufficient flatness of the separation plane can be ensured.

In ion implanted layer 2, a dose of ions is preferably within a range not less than $1 \times 10^{14}$ cm$^{-2}$ and not more than $2 \times 10^{18}$ cm$^{-2}$ and further preferably not less than $1 \times 10^{15}$ cm$^{-2}$ and not more than $8 \times 10^{17}$ cm$^{-2}$. When the dose of ions is within the range, a sufficient amount of atomic vacancies is formed in ion implanted layer 2. Since no atom is present at a position of the atomic vacancy, bonding strength of surrounding atoms is lessened. Therefore, when ion implanted layer 2 or the vicinity thereof absorbs light, the ion implanted layer is destroyed with the atomic vacancy being defined as the starting point. The dose of ions is calculated from an ion current at the time of implantation, an ion current density calculated from an area of irradiation, and a time period for implantation, and whether or not implantation as designed has been performed can be checked with secondary ion mass spectrometry (SIMS).

A thickness of or a dose in the ion implanted layer is designed in correspondence with intensity of irradiation light (laser). When intensity of condensed light (laser) is high, separation is achieved even though an amount of ion implantation is small. When intensity of condensed light (laser) is low, an amount of ion implantation is designed to relatively be great. An amount of ion implantation should be adjusted to such an extent that crystals at the outermost surface of a semiconductor into which ions are implanted do not collapse.

Ion implanted layer 2 has a maximum peak value of a density of atomic vacancies preferably within a range not lower than 0.001% and not higher than 100% and further preferably within a range not lower than 0.01% and not higher than 100%. With the density of the atomic vacancies within the range, destruction of ion implanted layer 2 can be promoted. When the maximum peak value of the density of the atomic vacancies is lower than 0.001%, there are few starting points of destruction of ion implanted layer 2 and power and a time period required for destroying ion implanted layer 2 will increase. In such a case, a highly crystalline semiconductor is also damaged. The density of the atomic vacancies is measured based on a visible transmittance or a near infrared transmittance. It can be calculated based on a density of atoms obtained through simulation of ion implantation and a calibration curve of measured values of a transmittance. The density of the atoms is expressed with a percentage relative to an ideal density of carbon atoms at a room temperature. Therefore, the density of the atomic vacancies can be determined without conducting measurement if conditions for ion implantation are set.

Ion implanted layer 2 may be an assembly of atomic vacancies or may contain an amorphous phase. The amorphous phase preferably contains many dangling bonds. In this case, when ion implanted layer 2 or the vicinity thereof absorbs light, ion implanted layer 2 is destroyed with the dangling bonds in the amorphous phase being defined as the starting points. Since an amorphous phase layer is formed as far as the outermost surface of seed substrate 1, separation does not proceed well. This is because epitaxial growth of semiconductor layer 3 on an upper surface of seed substrate 1 into which ions have been implanted becomes difficult. Therefore, there is an upper limit of the amount of ion implantation.

(Semiconductor Layer Growth Step)

Referring now to FIG. 1 (C), semiconductor layer 3 is grown on the main surface of seed substrate 1 with a vapor-phase synthesis method. Semiconductor layer 3 is more preferably a hetero epitaxial growth layer or a homo epitaxial growth layer.

Initially, one example of a growth method in an example where the semiconductor layer is composed of diamond will be described.

The vapor-phase synthesis method is not particularly limited, and PVD, CVD, MOCVD, VPE, molecular beam epitaxy, a sublimation method, and the like can be employed. Specifically, for example, in a method for synthesizing diamond with microwave plasma CVD, seed substrate 1 is set in a vacuum chamber, a pressure in the vacuum chamber is set to 2.66 kPa to 53.2 kPa, a temperature of the substrate in the chamber is increased to 800° C. to 1200° C., a hydrocarbon gas such as methane, a hydrogen gas, and an additive gas such as an inert gas and nitrogen are introduced, and semiconductor layer 3 composed of diamond is epitaxially grown on the main surface of seed substrate 1. The additive gas may be added as necessary or does not have to be added. A direction of growth of semiconductor layer 3 is in the upward direction in FIG. 1 (C). The upper surface of semiconductor layer 3 takes over the plane orientation of the main surface of seed substrate 1.

One example of a synthesis method in an example where the semiconductor layer is composed of gallium nitride, aluminum nitride, or zinc selenide will now be described.

In a method of growing gallium nitride with MOCVD, seed substrate 1 (typically, a substrate having the C plane of the (0001) plane as the main surface) is set in a furnace, a temperature of the substrate in the furnace is increased to 600° C. to 1300° C., a gas of organic gallium such as trimethylgallium, an ammonia gas, and a carrier gas such as hydrogen are introduced, and semiconductor layer 3 composed of gallium nitride is epitaxially grown on the main surface of seed substrate 1. A ratio of mixing between the trimethylgallium gas and the ammonia gas in a source material gas based on a volume is preferably set to 1:2000. A direction of growth of semiconductor layer 3 is in the upward direction in FIG. 1 (C). The upper surface of semiconductor layer 3 takes over the plane orientation of the main surface of seed substrate 1. The vapor-phase synthesis method is not limited to MOCVD and other generally known vapor-phase synthesis methods can also be employed.

In a method of growing aluminum nitride with a sublimation method, seed substrate 1 (a substrate having a (0001) plane or a (0002) plane) is set in a furnace, a temperature of the substrate in the furnace is held at 2000° C., an aluminum nitride source material is sublimated at 2400° C., and semiconductor layer 3 composed of aluminum nitride is epitaxially grown on the main surface of seed substrate 1. A direction of growth of semiconductor layer 3 is in the upward direction in FIG. 1 (C). The upper surface of semiconductor layer 3 takes over the plane orientation of the main surface of seed substrate 1. The vapor-phase synthesis method is not limited to the sublimation method and other generally known vapor-phase synthesis methods can also be employed.

In a method of synthesizing zinc selenide with a sublimation method, seed substrate 1 is set in a furnace, a temperature of the substrate in the furnace is held at 1000 to 1200° C., selenium and zinc representing source materials are introduced from polycrystalline zinc selenide representing a source material set at a higher temperature into an apparatus with an inert gas being used as a carrier gas, and semiconductor layer 3 composed of zinc selenide is epitaxially grown on the main surface of seed substrate 1. A direction of growth of semiconductor layer 3 is in the upward direction in FIG. 1 (C). The upper surface of semiconductor layer 3 takes over the plane orientation of the main surface of seed substrate 1. The vapor-phase synthesis method is not limited to the sublimation method and other generally known vapor-phase synthesis methods can also be employed.

One example of a synthesis method in an example in which the semiconductor layer is composed of silicon carbide will now be described.

Seed substrate 1 (the (0001) plane is typically employed as the main surface, however, it is angled off within a range from 0.05 to 10°) is set in a furnace, a temperature of the substrate in the furnace is increased with a high frequency to 1400° C. to 1600° C., a silicon-hydrogen based gas such as a monosilane gas, a hydrocarbon based gas such as a propane gas, and a carrier gas such as hydrogen are introduced, and semiconductor layer 3 composed of silicon carbide is epitaxially grown on the main surface of seed substrate 1. An atmospheric pressure horizontal cold wall CVD apparatus or the like is employed as the furnace. A ratio of mixing between a silicon based gas and a carbon based gas in the source material gas is desirably set to 1.5:1 or the like. A direction of growth of semiconductor layer 3 is in the upward direction in FIG. 1 (C). The upper surface of semiconductor layer 3 takes over the plane orientation of the main surface of seed substrate 1. The vapor-phase synthesis method is not limited to the method above and other generally known vapor-phase synthesis methods can also be employed.

Regarding relation of a light transmission property between semiconductor layer 3 and ion implanted layer 2, ion implanted layer 2 is lower in light transmittance preferably by at least 1% and further preferably by at least 5% than semiconductor layer 3. The light transmittance here refers to a value expressed with the expression (1).

Regarding relation of a light absorption coefficient between semiconductor layer 3 and ion implanted layer 2 at a wavelength of irradiation light, an absorption coefficient of ion implanted layer 2 is preferably at least 5 times and more preferably at least 30 times as high as an absorption coefficient of semiconductor layer 3. The light absorption coefficient here is expressed with the expression (4).

With the relation of the light transmittance or the light absorption coefficient between ion implanted layer 2 and semiconductor layer 3 being within the range, light passes through semiconductor layer 3 irradiated with light and is efficiently absorbed in ion implanted layer 2 when semiconductor layer 3 is irradiated with light. Therefore, a time period required for destruction of ion implanted layer 2 can be shortened.

In order for semiconductor layer 3 to be higher in light transmission property than ion implanted layer 2, it is effective to perform synthesis under a condition which will achieve higher crystallinity. The light transmission property of ion implanted layer 2 has been lowered due to point defects derived from atomic vacancies generated by implantation. At the outermost surface of seed substrate 1 into which ions have been implanted, order of the crystal lattices is kept much more satisfactorily than in ion implanted layer 2, and most of the point defects will not be taken over by subsequently grown semiconductor layer 3. Therefore, semiconductor layer 3 is higher in crystallinity than ion implanted layer 2.

Semiconductor layer 3 may be composed of a single crystal or a polycrystal. A single-crystal semiconductor is expensive. A polycrystalline semiconductor is effective in reduction of manufacturing cost. Semiconductor layer 3 may be conductive or insulating. Semiconductor layer 3 is preferably insulating, however, it may be implemented by a doped substrate in which ions of doping atoms have been implanted. In doping with a metal, however, when light is emitted from a side of semiconductor layer 3, light may not reach ion implanted layer 2. Therefore, in doping with a metal, light is emitted from a side of the main surface of seed substrate 1 where no semiconductor layer is formed so that light reaches ion implanted layer 2.

A stack including seed substrate 1 having ion implanted layer 2 and semiconductor layer 3 arranged on the main surface of seed substrate 1 shown in FIG. 1 (C) is herein also referred to as a "semiconductor-joined substrate." A semiconductor substrate can be fabricated through a separation step which will be described below, with the use of the semiconductor-joined substrate shown in FIG. 1 (C).

(Step of Separating Semiconductor Layer and Substrate from Each Other)

Referring now to FIG. 1 (D-1) and (D-2), a front surface of the main surface of at least any of semiconductor layer 3 and seed substrate 1 is irradiated with light 4. Referring to FIG. 1 (E), ion implanted layer 2 or the vicinity thereof absorbs light 4, energy of light vaporizes and expands ions present in the ion implanted layer, an expansion pressure pushes and spreads a portion of the ion implanted layer weak in bond between semiconductors, and semiconductor substrate 5 including semiconductor layer 3 and a part of the seed substrate (a seed substrate 1a) is separated from a most part of the seed substrate (a seed substrate 1b).

Since ion implanted layer 2 is formed through ion implantation, it contains at least any of ions, atomic vacancies, an amorphous portion, and dangling bonds of semiconductor atoms constituting a matrix. When ion implanted layer 2 or the vicinity thereof absorbs light 4, a temperature of ion implanted layer 2 increases, ion atoms present in the ion implanted layer or atoms not bonded to atoms in semiconductor lattices are vaporized and expand, and ion implanted layer 2 is destroyed with the atomic vacancies or dangling bonds which are portions weak in interatomic bond in ion implanted layer 2 being defined as starting points. Ion implanted layer 2 can be pressed and spread so as not to affect semiconductor layer 3. Ion implanted layer 2 is formed in such a manner that a front surface of seed substrate 1 into which ions are implanted is formed as being smooth or flat in advance and ions are implanted through that surface. Therefore, irregularities at an interface between ion implanted layer 2 and seed substrate 1 are less. Therefore, a separation plane between semiconductor substrate 5 and seed substrate 1b after light is absorbed by ion implanted layer 2 or the vicinity thereof to destroy the ion implanted layer is small in surface roughness. Since roughness of the separation plane is equivalent to surface roughness approximately as large as a thickness of the ion implanted layer, it can be smaller than 10 μm and further smaller than 1 μm.

Preferably, light 4 is condensed in ion implanted layer 2 and a point of condensation is scanned through the ion implanted layer. Though light 4 may be condensed in ion implanted layer 2, it may slightly deviate from ion implanted layer 2. Ion implanted layer 2 may become a light absorptive layer and absorb energy, or the vicinity of ion implanted layer 2 may absorb energy and transfer energy to implanted ions. Therefore, even though a distance of light condensation may slightly deviate, separation can irrespectively be achieved.

Light 4 may be emitted to the side of the main surface of semiconductor layer 3 as in FIG. 1 (D-1). Alternatively, light may be emitted to the side of the main surface of seed substrate 1 where semiconductor layer 3 is not formed as in FIG. 1 (D-2). The irradiated outermost surface may slightly be rough. Similarly to such principles that information in a compact disc (CD) can be extracted even though a front surface thereof is fogged, even though the irradiated outermost surface is slightly rough, light can successfully be absorbed in the ion implanted layer or the vicinity thereof.

Examples of a source of irradiation light can include pulse laser, continuous wave (CW) laser, a flash lamp, and a pulsed lamp. Use of a light source emitting pulsed light such as pulse laser, a flash lamp, or a pulsed lamp is preferred, because irradiation with light can be stopped before a temperature of the entire semiconductor is increased, irradiation with light can be resumed after the semiconductor is cooled, and a temperature of only the ion implanted layer can be increased. The pulsed lamp means a lamp which emits light substantially in a pulsed manner with a shield plate physically cutting off light or changing a course of light, although the lamp itself is of a continuous emission type.

When pulsed light is employed as a light source, irradiation fluence per pulse at a front surface of the main surface of at least any of semiconductor layer 3 and seed substrate 1 irradiated with light is preferably not lower than 0.01 J/mm$^2$ and not higher than 1500 J/mm$^2$ and further preferably not lower than 0.1 J/mm$^2$ and not higher than 500 J/mm$^2$. Thus, light can increase a temperature of only the ion implanted layer without increasing a temperature of the semiconductor layer and the substrate. Therefore, only the ion implanted layer can be destroyed without destroying the front surface of the main surface of the semiconductor layer and the seed substrate or generating cracks in the seed substrate and the semiconductor layer. When irradiation fluence per pulse of the pulsed light is lower than 0.01 J/mm$^2$, the number of pulses required for destruction of the ion implanted layer may increase or the pulsed light may not be able to destroy the ion implanted layer. When irradiation fluence per pulse of the pulsed light exceeds 1500 J/mm$^2$, the crystal structure at the front surface or in the inside of the seed substrate or the semiconductor layer may be damaged.

A pulse width of the pulsed light is preferably from 0.01 psec. to 10 msec., preferably not shorter than 0.01 nsec. and not longer than 10 msec., and further preferably not shorter than 0.1 nsec. and not longer than 1 msec. When the pulse width is shorter than 0.01 nsec., energy of the pulsed light enters an energy level which is sufficient to cut bond between atoms of a semiconductor, and hence the front surface of the main surface of the semiconductor layer and the seed substrate may be rough or may fracture. When the pulse width is shorter than 0.01 nsec., it is difficult to control a pulse width with a light irradiation apparatus. The pulse width exceeding 10 msec. affects increase in temperature not only of the ion implanted layer but also of the entirety including the seed substrate and the semiconductor. Increase in temperature of the entirety is also dependent on irradiation fluence. Therefore, when irradiation fluence is lower than 0.01 J/mm$^2$, a pulse width up to 100 msec. is permitted.

A pulse interval of the pulsed light is preferably from 0.1 nsec. to 100 msec. The lower limit is not shorter than 0.1 nsec., preferably not shorter than 10 nsec., more preferably not shorter than 1 μsec., and further preferably not shorter than 10 μsec. The upper limit is not longer than 100 msec., preferably not longer than 10 msec., and further preferably not longer than 1 msec. (A lower limit of a repetition frequency is preferably not shorter than 1 Hz, more preferably not shorter than 10 Hz, further preferably not shorter than 100 Hz, and still further preferably not shorter than 1 kHz. The upper limit is preferably not longer than 1000 mHz, more preferably not longer than 1000 kHz, and further preferably not longer than 100 kHz.) A ratio between the pulse interval and the pulse width is preferably from 10 to $10^9$, more preferably from 10 to $10^6$, and further preferably from 10 to 1000.

Pulse energy of the pulsed light at the front surface of the main surface of at least any of semiconductor layer 3 and seed substrate 1 irradiated with light is preferably not lower than 0.05 mJ and not higher than 1000 mJ. Thus, light can destroy only ion implanted layer 2 without destroying the front surface of the main surface of semiconductor layer 3 and seed substrate 1 or generating cracks in seed substrate 1 and semiconductor layer 3. When pulse energy is lower than 0.05 mJ, irradiation light cannot destroy the ion implanted layer. When pulse energy exceeds 1000 mJ, the irradiation light may destroy the semiconductor layer or the substrate other than the ion implanted layer. Pulse energy is further preferably not lower than 0.1 mJ and not higher than 50 mJ and further preferably not lower than 0.3 mJ and not higher than 30 mJ.

Laser beams are preferably employed as irradiation light. Use of laser beams can obtain an effect of ease in varying a width or intensity of pulses and selectability of a wavelength suitable for absorption. Solid laser, liquid laser, or gas laser can be employed in accordance with an absorption wavelength of the ion implanted layer. Specifically, glass laser, yttrium aluminum garnet (YAG) laser, yttrium lithium fluoride (YLF) laser, $CO_2$ laser, excimer laser, or Yb-doped fiber laser can be employed. Alternatively, laser with double-wavelength or triple-wavelength of such laser may be obtained through second harmonic generation (SHG) for use.

A wavelength of laser beams can be selected as appropriate within a range from 250 nm to 10.6 μm in accordance with an absorption wavelength of ion implanted layer 2. For example, a wavelength not shorter than 250 nm and not longer than 400 nm is preferred and a wavelength not shorter than 450 nm and not longer than 550 nm is further preferred. Furthermore, a wavelength not shorter than 1 μm and not longer than 2 μm is more preferred. A longer wavelength of laser beams is preferred because a ratio of laser beams contributing to energy for expansion by thermally gasifying implanted ions is higher than a ratio of laser beams which cut bond between semiconductor atoms forming a matrix through multigrid absorption.

The laser beams preferably scan the front surface of the main surface of semiconductor layer 3 or seed substrate 1. A speed of scanning is determined by a pulse interval (a frequency) and a size of light (a size of laser beams). A speed of operation is preferably at least twice and at most 30 times and further preferably at least 5 times and at most 20 times as high as a pulse frequency×a beam size. Thus, the front surface can be processed to be flatter and separation can be achieved efficiently in a short period of time without waste.

Separation of semiconductor substrate 5 and seed substrate 1b from each other is preferably performed in a liquid. Since impacts applied to semiconductor substrate 5 and seed substrate 1b due to irradiation with light can thus be lessened, generation of cracks in seed substrates 1a and 1b and semiconductor layer 3 can be suppressed. The liquid is not particularly restricted so long as it can lessen impacts applied by laser beams, and for example, pure water, various aqueous solutions, and various types of oil, or a soft solid such as a solid gel can be employed.

Separation of semiconductor substrate 5 and seed substrate 1b from each other is preferably performed while an ambient temperature is lowered. Thus, thermal expansion of seed substrates 1a and 1b or semiconductor layer 3 due to irradiation light can be lessened and generation of cracks in seed substrates 1a and 1b and semiconductor layer 3 can be suppressed. Cooling can be performed, for example, by introducing a coolant atmosphere or with the use of cooled liquids such as pure water, various aqueous solutions, various types of oil, or a cooled solid gel.

As shown in FIG. 1 (E), the separation plane between separated seed substrate 1b and semiconductor substrate 5 is small in surface roughness. When semiconductor substrate 5 including seed substrate 1a and semiconductor layer 3 is used as an application product such as a substrate for a device, it may be necessary to planarize the front surface. Since the separation plane of seed substrate 1a included in semiconductor substrate 5 is small in surface roughness, process to an application product such as a substrate for a device can readily be performed. In order to use separated seed substrate 1b again for a substrate for epitaxial growth, the front surface should be planarized. Since seed substrate 1b has the separation plane small in surface roughness, it can readily be processed to a seed substrate. Ultimately, separation with laser after chemical vapor deposition (CVD) epitaxy can be performed after ion implantation through the same process without processing again to a substrate.

Surface roughness (Ra) of the separation plane between separated seed substrate 1b and semiconductor substrate 5 is preferably smaller than 10 vim, more preferably not greater than 1 μm, and further preferably smaller than 0.3 μm. Process for planarizing the front surface is thus facilitated. Surface roughness (Ra) means arithmetic mean roughness under the definition in JIS B 0601-2013 and refers to roughness obtained in an expression (5) below and expressed in micrometer (μm) when only a reference length is extracted from a roughness curve in a direction of an average line, an X axis is defined in a direction of the average line of the extracted portion and a Y axis is defined in a direction of a vertical scale factor, and the roughness curve is expressed as y=f(x).

$$Ra \frac{1}{l} \int_0^l |f(x)| dx \quad (5)$$

Separated seed substrate 1b can be planarized through common mechanical polishing and Ra can be 0.1 nm. When ions are implanted through the front surface of seed substrate 1 to form ion implanted layer 2 and ion implanted layer 2 is destroyed through irradiation with light, flatness of the separation plane is lowered. Flatness of the separation plane, however, can be improved by such measures as decrease in thickness of ion implanted layer 2, a lower speed of scanning with light, or use of low power.

Second Embodiment

A semiconductor substrate according to the embodiment of the present invention is semiconductor substrate 5 obtained with the method for manufacturing a semiconductor substrate in the first embodiment. Semiconductor substrate 5 achieves reduction in manufacturing cost because a time period for separation from seed substrate 1b is shortened.

The semiconductor substrate according to the embodiment of the present invention is semiconductor substrate 5 including semiconductor layer 3 formed with a vapor-phase synthesis method. Semiconductor substrate 5 includes a first main surface and a second main surface. The first main surface contains a first element different in type or state of bonding from a main element forming the semiconductor substrate. The first element includes at least one selected from the group consisting of hydrogen, oxygen, nitrogen, carbon, helium, neon, and argon. The first main surface has surface roughness smaller than 10 μm. The semiconductor substrate has a flat front surface and is readily processed to various applications. The first main surface has surface roughness preferably not greater than 1 μm and more preferably smaller than 0.3 μm. The semiconductor substrate in the present embodiment can be fabricated with the method for manufacturing a semiconductor substrate in the first embodiment. In this case, a front surface of the first main surface of the semiconductor substrate in the present embodiment corresponds to a front surface of seed substrate 1a. At least one element selected from the group consisting of hydrogen, oxygen, nitrogen, carbon, helium, neon, and argon, which is a first element contained in the first main surface, is derived from ions implanted in ion implantation. Though most of ions implanted in ion implantation are removed when the semiconductor substrate is separated, the ions remain in a part of the ion implanted layer where there are few defects. A distribution of elements resulting from ion implantation has already been known and an element resulting from ions is different in type or state of bonding from the main element forming the semiconductor substrate. Therefore, presence in the first main surface of ions implanted in ion implantation can be distinguished. The front surface poses no problem unless it is used as a front surface of a semiconductor substrate on which a device is to be formed. When it is used as a backside surface of the substrate, remaining implanted ions are present between carbon bonds. Then, only the outermost surface is formed from a layer which is not so hard. When such a surface is joined to a substrate of a different type, it advantageously serves as a cushion. This layer can subsequently be removed though plasma etching or chemical etching polishing (if possible) or can mechanically be removed. Therefore, the layer can also be used as a front surface of a semiconductor where a device is to be formed. On the other hand, the layer is at the same time disadvantageous in that an etch pit is created, mechanical strain is accumulated, or extra cost is incurred, and hence a step of forming again a satisfactory epitaxial film should be performed. Since a growth surface facing a separation surface is an epitaxially formed front surface, it poses no problem as a front surface where a semiconductor device is to be formed.

A crack included in a front surface of the first main surface has a length not greater than 100 μm and an altered layer included in the front surface has a maximum diameter preferably not greater than 100 μm. This crack can be observed with an optical microscope as a linear black shade. Though the crack is caused by local and instantaneous expansion, it is small and remains in the front surface. Therefore, the crack does not particularly give rise to a problem unless the surface is used as a front surface of a semiconductor substrate where a device is to be formed. The altered layer refers to a portion of an amorphous layer and can be confirmed with RHEED based on presence of a ring pattern. Strain of the crack has already been released and the altered layer is amorphous. Therefore, cleavage does not occur. Therefore, when the surface is used as a backside surface to be joined to a substrate of a different type again, it functions to stop development of a new crack and durability against fracture is advantageously exhibited. Such a layer can subsequently be removed through plasma etching or chemical etching polishing (if possible) or can mechanically be removed. Therefore, the layer can also be used as a front surface of a semiconductor where a device is to be formed. On the other hand, the layer is at the same time disadvantageous in that an etch pit is created, mechanical strain is accumulated, or extra cost is incurred, and hence a step of forming again a satisfactory epitaxial film should be performed. Since a growth surface facing a separation surface is an epitaxially formed front surface, it poses no problem as a front surface where a semiconductor device is to be formed.

The first element representing at least one of the main elements forming the semiconductor substrate is preferably present at the front surface of the first main surface in a state of atomic bond different from that in semiconductor lattices of the semiconductor substrate. Presence of an element different in state of bonding at the front surface can be checked through observation with XPS or AES. Since the first element remains at the front surface, it does not particularly give rise to a problem in use of a substrate unless the surface is used as a front surface of the semiconductor substrate where a device is to be formed. The first element loosely remains at the secure front surface. Therefore, when the surface is used as a backside surface to be joined to a substrate of a different type, advantageously, the surface advantageously prevents fracture and functions as a cushion. Such a layer can subsequently be removed through plasma etching or chemical etching polishing (if possible) or can mechanically be removed. Therefore, the layer can also be used as a front surface of a semiconductor where a device is to be formed. On the other hand, the layer is at the same time disadvantageous in that an etch pit is created, mechanical strain is accumulated, or extra cost is incurred, and hence a step of forming again a satisfactory epitaxial film should be performed. Since a growth surface facing a separation surface is an epitaxially formed front surface, it poses no problem as a front surface where a semiconductor device is to be formed.

The first element representing at least one of the main elements forming the semiconductor substrate is preferably present at the front surface of the first main surface in a state of atomic bond different from that in semiconductor lattices of the semiconductor substrate and in a plurality of substantially circular patterns. Presence of an element different in state of bonding at the front surface and a pattern thereof can be checked through observation by mapping with XPS or AES. The first element may instantaneously be expanded by physical energy applied when semiconductor substrate 5 is separated from seed substrate 1*b* and may form a plurality of substantially circular patterns. The plurality of substantially circular patterns may form an envelope. The present front surface does not particularly give rise to a problem in use of the substrate unless it is used as a front surface of a semiconductor substrate where a device is to be formed. The first element loosely and partially remains in the secure front surface. Therefore, when the surface is joined to a substrate of a different type, advantageously, the surface advantageously functions as a cushion. Such a layer can subsequently be removed through plasma etching or chemical etching polishing (if possible) or can mechanically be removed. Therefore, the layer can also be used as a front surface of a semiconductor where a device is to be formed. On the other hand, the layer is at the same time disadvantageous in that an etch pit is created, mechanical strain is accumulated, or extra cost is incurred, and hence a step of forming again a satisfactory epitaxial film should be performed. Since a growth surface facing a separation surface is an epitaxially formed front surface, it poses no problem as a front surface where a semiconductor device is to be formed.

The semiconductor substrate according to the present embodiment can be used for a substrate for a device or other application products to which the substrate is applied. Since the substrate for the device or the application products include the semiconductor substrate, manufacturing cost is reduced.

Application products in an example where semiconductor layer 3 is composed of diamond specifically include cutting tools such as a diamond cutting tool, a drill, an end mill, a throw-away cutting insert for a drill, a throw-away cutting insert for an end mill, a throw-away cutting insert for milling, a throw-away cutting insert for cutting, a metal saw, a gear cutting tool, a reamer, and a tap. Without being limited to the cutting tools, the products include a grinding tool, a wear resistant tool, and a part. Examples of the grinding tool include a dresser. Examples of the wear resistant tool and the part include a die, a scriber, a water or powder injection nozzle, and a guide for a wire or the like. Examples of thermal applications include a heat sink for a semiconductor device such as a high-power laser diode (LD) or a high-power semiconductor light emitting element (LED), and examples of optical applications include a material for a window for high-power laser and an X-ray target.

Application products in an example where semiconductor layer 3 is composed of gallium nitride include a substrate for a blue LED or a white LED and a substrate for a high-efficiency switching device.

Application products in an example where semiconductor 3 is composed of silicon carbide include a substrate for power control or for a high-efficiency power device mounted on a car.

Third Embodiment

<Method for Manufacturing Combined Semiconductor Substrate>

Figure 3:
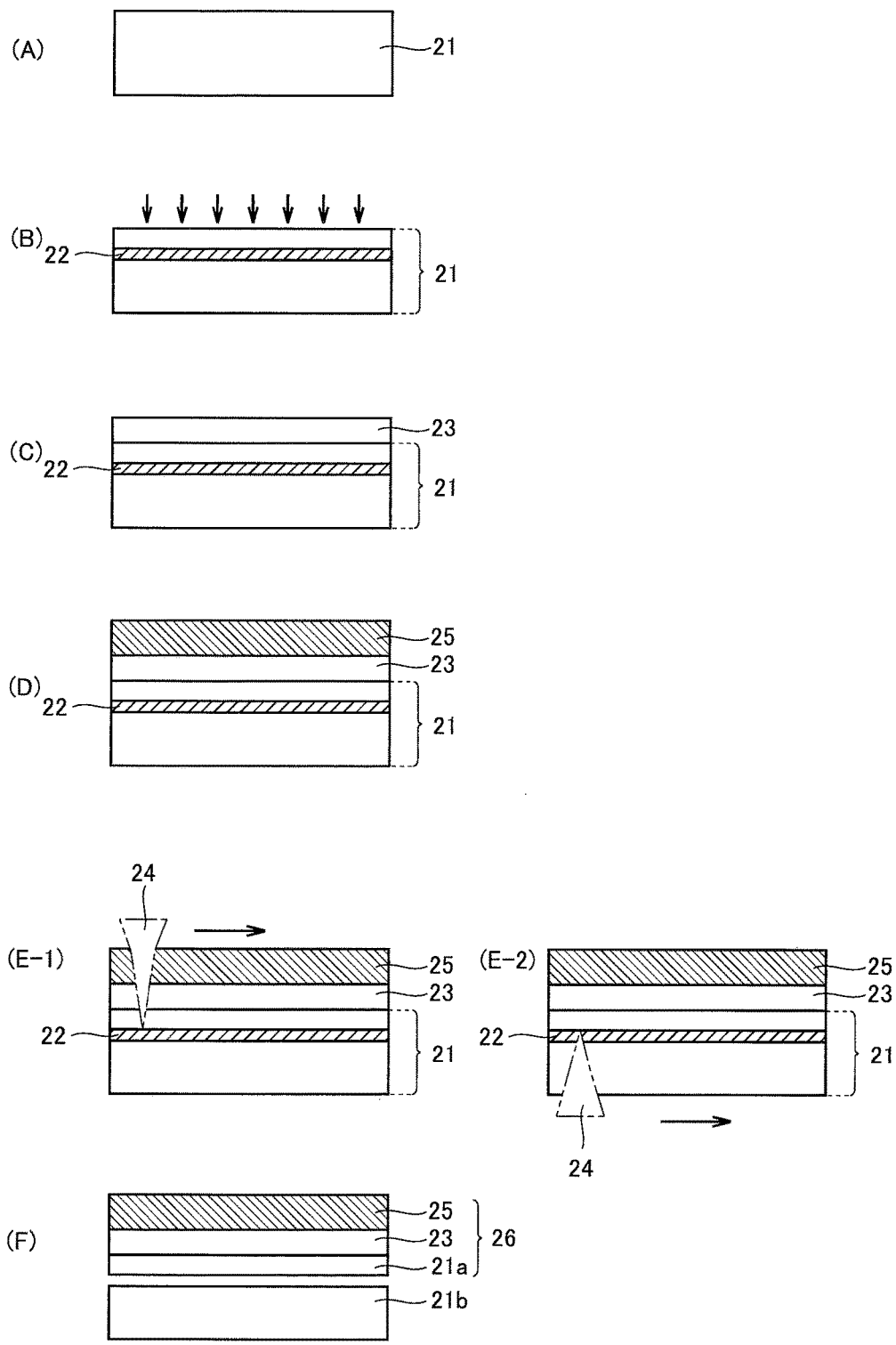
FIG. 3 (A) to (F) is a diagram schematically showing a method for manufacturing a combined semiconductor substrate according to one manner of the present invention.
Figure 4:
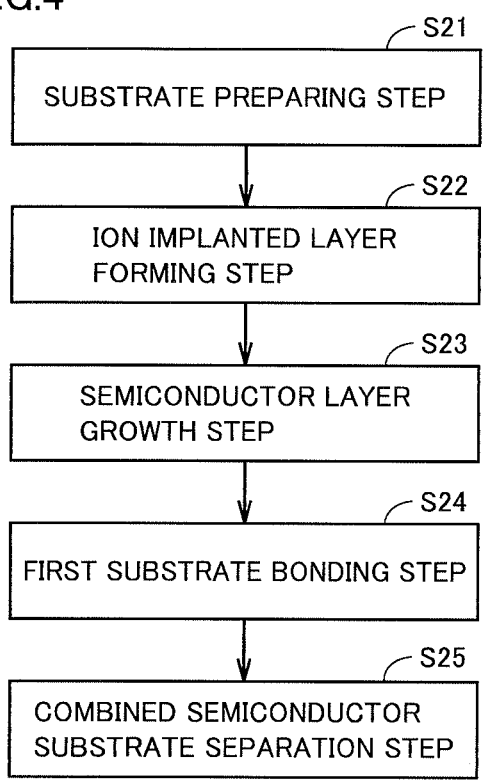
FIG. 4 is a flowchart showing the method for manufacturing a combined semiconductor substrate according to one manner of the present invention.

FIG. 3 (A) to (F) is a diagram schematically showing a method for manufacturing a combined semiconductor substrate according to the embodiment of the present invention. FIG. 4 is a flowchart showing the method for manufacturing a combined semiconductor substrate according to the embodiment of the present invention.

The method for manufacturing a combined semiconductor substrate according to the embodiment of the present invention includes preparing a seed substrate containing a semiconductor material (shown in FIG. 3 (A) and as a substrate preparing step (S21) in FIG. 4), forming an ion implanted layer at a certain depth from a front surface of a main surface of the seed substrate by implanting ions into the seed substrate (shown in FIG. 3 (B) and as an ion implanted layer forming step (S22) in FIG. 4), growing a semiconductor layer on the main surface of the seed substrate with a vapor-phase synthesis method (shown in FIG. 3 (C) and as a semiconductor layer growth step (S23) in FIG. 4), bonding a first substrate onto the semiconductor layer (shown in FIG. 3 (D) and as a first substrate bonding step (S24) in FIG. 4), and separating a combined semiconductor substrate including the first substrate, the semiconductor layer, and a part of the seed substrate by irradiating the front surface of the main surface of at least any of the first substrate and the seed substrate with light (shown in FIG. 3 (E-1), (E-2), and (F) and as a combined semiconductor substrate separation step (S25) in FIG. 4).

In the method for manufacturing a combined semiconductor substrate according to a third embodiment, the same method including the substrate preparing step (S1), the ion implanted layer forming step (S2), the semiconductor layer growth step (S3), and the semiconductor substrate separation step (S4) in the method for manufacturing a semiconductor substrate according to the first embodiment can be adopted for the substrate preparing step (S21), the ion implanted layer forming step (S22), the semiconductor layer growth step (S23), and the combined semiconductor substrate separation step (S25). Therefore, the first substrate bonding step (S24) representing a difference from the first embodiment will be described below.

(First Substrate Bonding Step)

As shown in FIG. 3 (D), a first substrate 25 is bonded onto a semiconductor layer 23. Thus, even when semiconductor layer 23 is formed to such a small thickness as not being freestanding, a combined semiconductor substrate 26 including semiconductor layer 23 and first substrate 25 can be freestanding and handleability is satisfactory. Since expensive semiconductor layer 23 can be smaller in thickness in the third embodiment than in the first embodiment, cost for manufacturing combined semiconductor substrate 26 is reduced.

For example, a silicon oxide ($SiO_2$) substrate can be employed as first substrate 25. The silicon oxide substrate can be bonded onto an $SiO_2$ layer after the $SiO_2$ layer is formed on semiconductor substrate 23 polished to be very flat. A plurality of first substrates 25 may be used. For example, an $SiO_2$ layer may be formed on first substrate 25 and a plurality of $SiO_2$ substrates may be bonded onto the $SiO_2$ layer. A material for the first substrate is not limited to $SiO_2$ and other materials (such as a metal) can also be used so long as a clean and flat film can be formed on a front surface. Examples of other materials include gold (Au), titanium (Ti), molybdenum (Mo), tantalum (Ta), and tungsten (W). A semiconductor, ceramics, a single-crystal material, or a polycrystalline material may be applicable. For example, silicon (Si), germanium (Ge), or alumina ($Al_2O_3$) is also applicable. Any combination preferably brings about a substrate more inexpensive than a semiconductor substrate to be separated.

A substrate composed of a resin can be employed for first substrate 25. This is realized only when the present invention is directed to a technique permitting separation at a room temperature. When semiconductor layer 23 is to be used in a high-temperature process, a main surface of a seed substrate 21 of combined semiconductor substrate 26 is bonded to another heat resistant substrate with the use of an adhesive and thereafter first substrate 25 composed of a resin is removed in a proper liquid such as alcohol, or first substrate 25 is detached by removing an adhesive between first substrate 25 and semiconductor layer 23. When first substrate 25 is composed of a resin, a front surface of first substrate 25 may slightly be lower in flatness than first substrate 25 composed of $SiO_2$. This is because an adhesive layer composed of a soft and thin adhesive can be arranged between first substrate 25 and semiconductor layer 23.

Fourth Embodiment

<Method for Manufacturing Combined Semiconductor Substrate>

Figure 5:
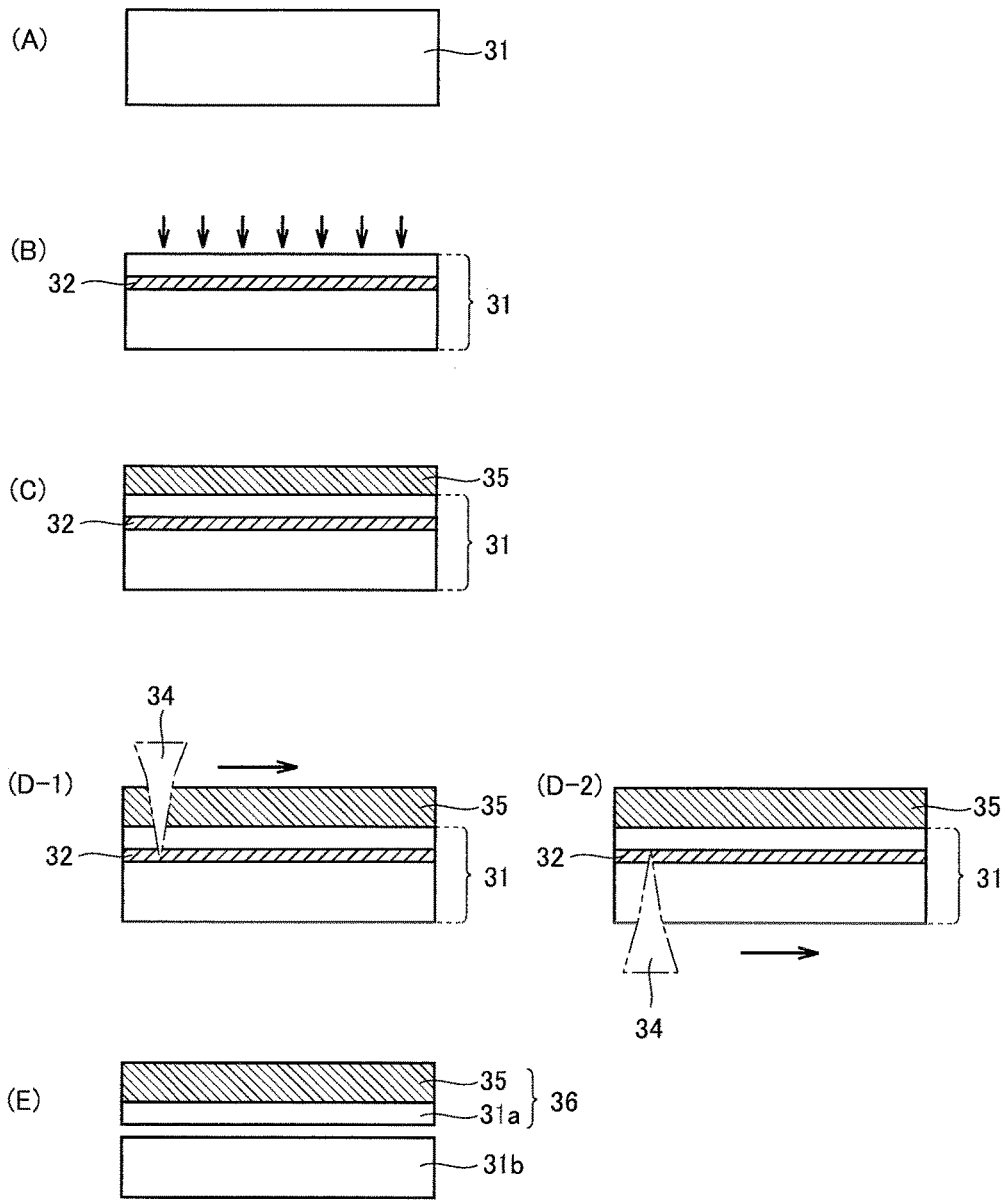
FIG. 5 (A) to (E) is a diagram schematically showing a method for manufacturing a combined semiconductor substrate according to one manner of the present invention.
Figure 6:
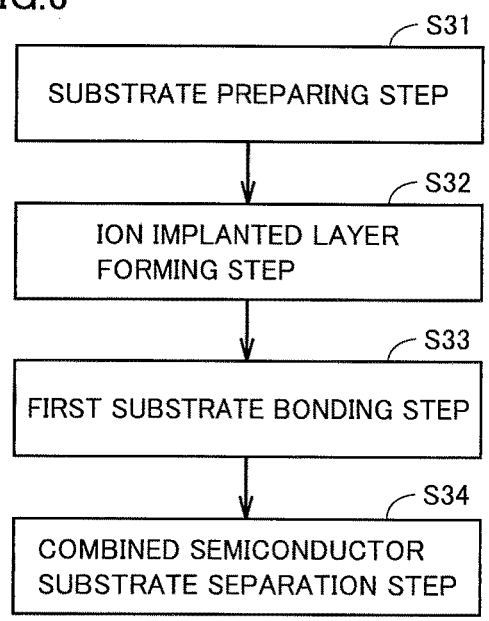
FIG. 6 is a flowchart showing the method for manufacturing a semiconductor substrate according to one manner of the present invention.

FIG. 5 (A) to (E) is a diagram schematically showing a method for manufacturing a combined semiconductor substrate according to the embodiment of the present invention. FIG. 6 is a flowchart showing the method for manufacturing a combined semiconductor substrate according to the embodiment of the present invention.

The method for manufacturing a combined semiconductor substrate according to the embodiment of the present invention includes preparing a seed substrate containing a semiconductor material (shown in FIG. 5 (A) and as a substrate preparing step (S31) in FIG. 6), forming an ion implanted layer at a certain depth from a main surface of the seed substrate by implanting ions in the seed substrate (shown in FIG. 5 (B) and as an ion implanted layer forming step (S32) in FIG. 6), bonding a first substrate onto the main surface of the seed substrate (shown in FIG. 5 (C) and as a first substrate bonding step (S33) in FIG. 6), and separating a combined semiconductor substrate including the first substrate and a part of the seed substrate by irradiating the front surface of the main surface of at least any of the first substrate and the seed substrate with light (shown in FIG. 5 (D-1), (D-2), and (E) and as a combined semiconductor substrate separation step (S34) in FIG. 6).

The method for manufacturing a combined semiconductor substrate according to a fourth embodiment includes the steps the same as in the third embodiment except for not including the semiconductor layer growth step (S23) in the method for manufacturing a combined semiconductor substrate in the third embodiment.

In the method for manufacturing a combined semiconductor substrate according to the fourth embodiment, a first substrate 35 is directly bonded onto the main surface of a seed substrate 31. In an obtained combined semiconductor substrate 36, a layer of a seed substrate 31a is thinly formed on a front surface of first substrate 35. Even when seed substrate 31a is sliced so thinly as not being freestanding, combined semiconductor substrate 26 can be freestanding and handleability is satisfactory. Since an expensive semiconductor layer is not formed, cost for manufacturing combined semiconductor substrate 36 is lower in the fourth embodiment than in the third embodiment.

Fifth Embodiment

A combined semiconductor substrate according to the embodiment of the present invention is combined semiconductor substrate 26 or 36 obtained with the method for manufacturing a combined semiconductor substrate in the third or fourth embodiment. Combined semiconductor substrate 26 or 36 achieves reduction in manufacturing cost because a time period for separation from seed substrate 21b or 31b is shortened. Since combined semiconductor substrate 26 or 36 can be obtained without making a thickness of expensive semiconductor layer 23 smaller or without fabricating a semiconductor layer, manufacturing cost is reduced.

The combined semiconductor substrate according to one manner of the present invention includes a first substrate and a semiconductor layer stacked on a main surface of the first substrate. A main surface of the combined semiconductor substrate on a side of the semiconductor layer contains a first element different in type or state of bonding from a main element forming the semiconductor layer. The first element includes at least one selected from the group consisting of hydrogen, oxygen, nitrogen, carbon, helium, neon, and argon. The main surface of the combined semiconductor substrate on the side of the semiconductor layer has surface roughness smaller than 10 µm. The semiconductor layer has a thickness not smaller than 0.1 µm and not greater than 50 µm. The semiconductor substrate has a flat front surface and is readily processed into various applications. Though the present combined semiconductor substrate contains the first element, it preferably allows passage of light therethrough.

Combined semiconductor substrate 26 or 36 can be used for application products similarly to the semiconductor substrate in the second embodiment.

Sixth Embodiment

A semiconductor-joined substrate in a sixth embodiment of the present invention can be fabricated as below. The process up to the "seed substrate preparing step," the "ion implanted layer forming step," and the "semiconductor layer growth step" in the method employed in the first embodiment is similarly performed. Then, a growth surface is polished to be flat without separating the semiconductor substrate. Regarding flatness, Ra is preferably not greater than 100 nm, more preferably not greater than 10 nm, and further preferably not greater than 1 nm. This flatness allows direct joint or bonding after SOG is applied to a very small thickness at the time of joint. A polished front surface has parallelism to the ion implanted layer preferably not greater than 1°, more preferably not greater than 0.1°, and further preferably not greater than 0.03°. Higher parallelism greatly affects a distribution of a thickness of a semiconductor layer when separation is subsequently performed. A smaller thickness of the semiconductor layer will lead to greater influence. A uniform distribution of a thickness brings about satisfactory characteristics as a semiconductor. Thus, though the semiconductor-joined substrate is such that a semiconductor layer is not separated from a seed substrate at an ion implanted layer, it is characterized by being used as being subsequently separated at a room temperature or a low temperature not higher than 500° C. Conditions for ion implantation are as described also in the first embodiment. In addition, for the present semiconductor-joined substrate, a dose of ions is desirably within a range not less than $1\times10^{15}$ cm$^{-2}$ and less than $3\times10^{16}$ cm$^{-2}$. Such a range can ensure transparency and allow separation with energy of irradiation light.

The semiconductor-joined substrate can effectively be used when a semiconductor layer is small in thickness, for example, when the semiconductor layer has a thickness not greater than 200 μm. With the semiconductor layer being small in thickness, when the substrate is separated and is freestanding, the substrate tends to fracture. A semiconductor layer in the semiconductor-joined substrate has a thickness preferably not greater than 140 μm, more preferably not greater than 90 μm, and further preferably not greater than 50 μm. The semiconductor layer is preferably not smaller than 1 μm, and with this thickness, it can function as the semiconductor layer. The semiconductor-joined substrate can be joined also to a substrate or a circuit which cannot be subjected to heat treatment, and thereafter a seed substrate can be separated. For example, the joint substrate can be joined with solder at a room temperature to a circuit substrate in which an electronic circuit has been formed, thereafter the seed substrate is separated through irradiation with light, and a state that a thin semiconductor layer is bonded to the circuit substrate can be achieved. When the semiconductor layer is formed from a diamond layer, a bare GaN chip (a laser diode chip) can be joined thereto so as to form a heat sink for a laser diode. When the semiconductor layer is formed from a GaN layer, a light emitting diode (LED) or a laser diode (LD) can be mounted for forming a hybrid device.

Seventh Embodiment

<Method for Manufacturing Semiconductor Substrate>

Figure 7:
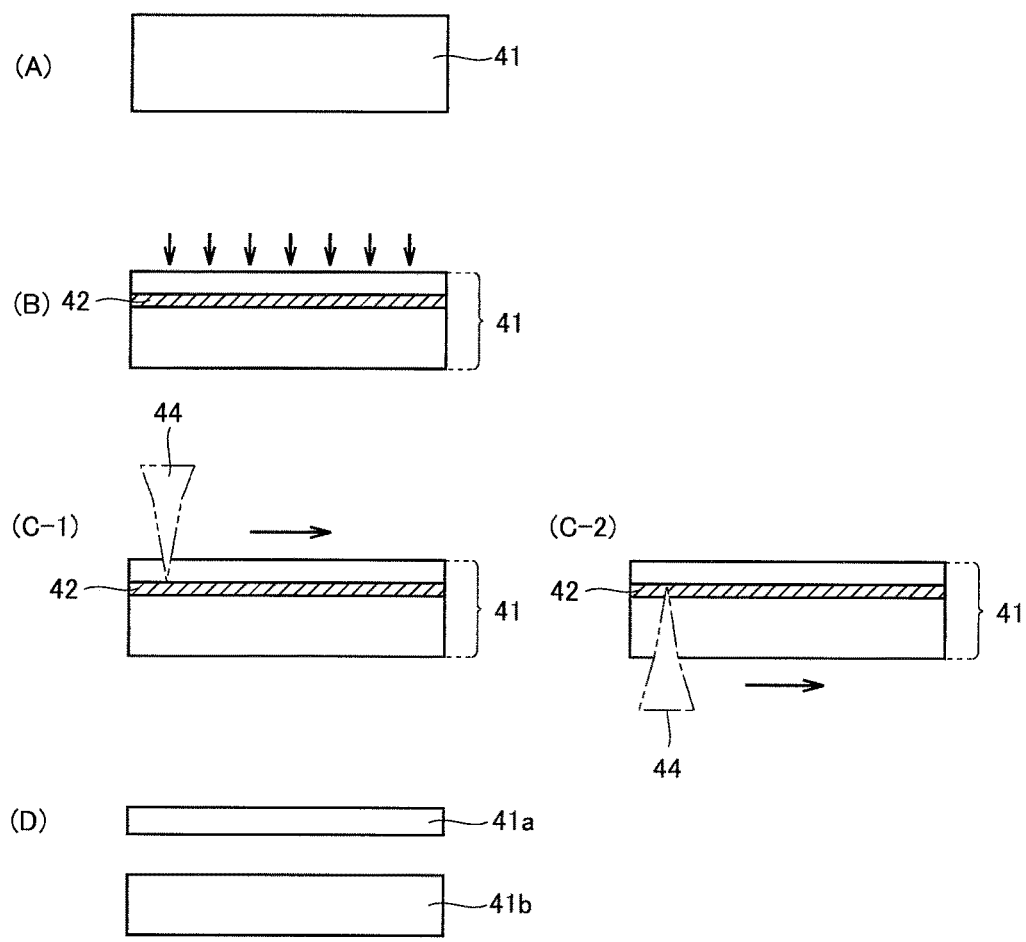
FIG. 7 (A) to (D) is a diagram schematically showing a method for manufacturing a semiconductor substrate according to one manner of the present invention.
Figure 8:
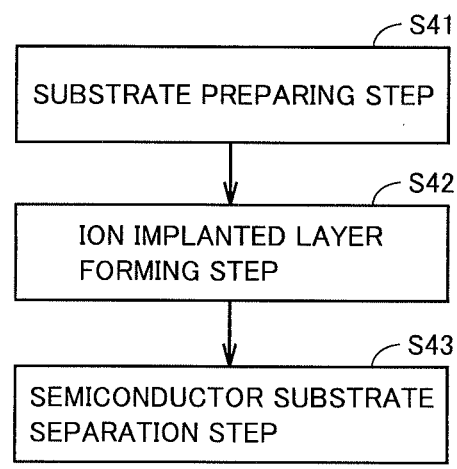
FIG. 8 is a flowchart showing the method for manufacturing a semiconductor substrate according to one manner of the present invention.

FIG. 7 (A) to (D) is a diagram schematically showing a method for manufacturing a semiconductor substrate according to the embodiment of the present invention. FIG. 8 is a flowchart showing the method for manufacturing a semiconductor substrate according to the embodiment of the present invention.

The method for manufacturing a semiconductor substrate according to the embodiment of the present invention includes preparing a seed substrate containing a semiconductor material (shown in FIG. 7 (A) and as a substrate preparing step (S41) in FIG. 8), forming an ion implanted layer at a certain depth from a front surface of a main surface of the seed substrate by implanting ions into the seed substrate (shown in FIG. 7 (B) and as an ion implanted layer forming step (S42) in FIG. 8), and separating a semiconductor substrate including a part of the seed substrate by irradiating the front surface of the main surface of the seed substrate with light (shown in FIG. 7 (C-1), (C-2), and (D) and as a semiconductor separation step (S43) in FIG. 8).

The method for manufacturing a semiconductor substrate according to the seventh embodiment includes the steps the same as in the first embodiment except for not including the semiconductor layer growth step (S3) in the method for manufacturing a semiconductor substrate in the first embodiment.

Example 1

Though the embodiments of the present invention will further specifically be described below with reference to examples, the embodiments of the present invention are not limited thereto.

In Example 1, the method for manufacturing a semiconductor substrate according to the first embodiment was reviewed.

[Specimens 1-1 and 1-2]
(Preparation of Seed Substrate)

Initially, seed substrate 1 formed from a high-temperature high-pressure synthesis IIa type single-crystal diamond substrate having a size of 6 mm×6 mm and a thickness of 1 mm was prepared. After a front surface of seed substrate 1 was mechanically polished, the front surface of seed substrate 1 was etched to a thickness of 1 μm to 2 μm through reactive ion etching.

(Formation of Ion Implanted Layer)

Then, ion implanted layer 2 was formed by implanting hydrogen ions through the main surface of seed substrate 1. Implantation energy was set to 200 keV and a dose was set to $1\times10^{15}$/cm$^2$ (specimen 1-1) and $1\times10^{16}$/cm$^2$ (specimen (1-2). A depth of ion implanted layer 2 from the front surface of the main surface of seed substrate 1 was approximately 0.34 μm and ion implanted layer 2 had a thickness of approximately 0.06 μm.

A light transmission property of ion implanted layer 2 was visually checked. Each specimen was transparent and a difference in light transmittance between seed substrate 1 and ion implanted layer 2 could not clearly be confirmed.

(Formation of Diamond Layer)

Then, seed substrate 1 having ion implanted layer 2 formed was set in a vacuum chamber of a microwave plasma CVD apparatus such that a surface through which ions had been implanted was exposed. Seed substrate was heated to a temperature of 800° C. and a pressure in the vacuum chamber was set to 13.3 kPa. Thereafter, semiconductor layer 3 formed from a single-crystal diamond layer having a thickness of 500 μm was formed on seed substrate 1 by introducing a hydrogen gas, a methane gas, and a nitrogen gas into the vacuum chamber and performing microwave plasma CVD. A ratio (volume %) of blend among gases here was set to the hydrogen gas:the methane gas:the nitrogen gas=92:8:0.005.

For samples of specimen 1-1 and specimen 1-2, a light transmittance (T1) of seed substrate 1, a light transmittance (T2) of ion implanted layer 2, and a light transmittance (T3) of the diamond layer (semiconductor layer 3) were measured with a common spectrophotometer in ultraviolet, visible, and near infrared regions. Each specimen achieved a ratio (T2/T1) between the light transmittance (T1) of the substrate and the light transmittance (T2) of the ion implanted layer for light having a wavelength of 800 nm was not lower than 99%. A ratio (T2/T3) between the light transmittance (T2) of the ion implanted layer and the light transmittance (T3) of the diamond layer for the light having a wavelength of 800 nm was not lower than 99%.

(Separation of Semiconductor Substrate)

Then, the front surface of the main surface of the diamond layer (semiconductor layer 3) was irradiated with YAG laser beams having a wavelength of 1.06 μm. The laser beams were emitted at a pulse interval of 40 μsec. and a pulse width of 10 nsec. as being condensed to a diameter of 30 μm at the front surface of the main surface. A focus of the laser beams was located in the ion implanted layer. A speed of scanning by the laser beams was set to 25 mm/second. Pulse energy (A) of the laser beams was selected from a range not lower than 0.01 mJ and not higher than 10 mJ. Irradiation fluence per pulse at the front surface of the main surface of the diamond layer (semiconductor layer 3) was set to 1410 mJ/mm². The laser beams were emitted in any selected condition from among air at a room temperature (25° C.), cooled air (−5° C.), pure water (25° C.), and a commercially available engine oil (25° C.). Consequently, seed substrate 1b was separated from semiconductor substrate 5 including the diamond layer (semiconductor layer 3) and seed substrate 1a. A time period required for separation in air at a room temperature was 11 minutes for specimen 1-1 and 7 minutes for specimen 1-2.

TABLE 1

| | | Ion Implanted Layer | | Light Transmittance (@800 nm) | | Laser Beam Irradiation Conditions | |
|---|---|---|---|---|---|---|---|
| Specimen | Type of Implanted Ions | Energy (keV) | Dose (cm$^{-2}$) | Visually Recognized Ion Implanted Layer | T2/T3 (%) | Wavelength (μm) | Pulse Energy A (mJ) |
| 1-1 | Hydrogen Ions | 200 | $1 \times 10^{15}$ | Transparent | ~100% | 1.06 | $0.01 \leq A < 10$ |
| 1-2 | Hydrogen Ions | 200 | $1 \times 10^{16}$ | Transparent | ~100% | 1.06 | $0.01 \leq A < 10$ |
| 2 | Nitrogen Ions | 200 | $1 \times 10^{16}$ | Substantially Transparent | >95% | 1.06 | $0.01 \leq A < 10$ |
| 3 | Oxygen Ions | 200 | $1 \times 10^{16}$ | Substantially Transparent | >95% | 1.06 | $0.01 \leq A < 10$ |
| 4 | Helium Ions | 200 | $1 \times 10^{16}$ | Transparent | ~100% | 1.06 | $0.01 \leq A < 10$ |
| 5 | Carbon Ions | 200 | $1 \times 10^{16}$ | Substantially Transparent | >95% | 1.06 | $0.01 \leq A < 10$ |
| 6 | Hydrogen Molecule Ions | 200 | $1 \times 10^{16}$ | Transparent | ~100% | 1.06 | $0.01 \leq A < 10$ |
| 7 | Argon Ions | 200 | $1 \times 10^{16}$ | Substantially Transparent | >95% | 1.06 | $0.01 \leq A < 10$ |
| 8 | Hydrogen Ions | 200 | $1 \times 10^{15}$ | Transparent | ~100% | 1.06 | $10 \leq A < 50$ |
| 9 | Nitrogen Ions | 200 | $1 \times 10^{15}$ | Substantially Transparent | >98% | 1.06 | $10 \leq A < 50$ |
| 10 | Oxygen Ions | 200 | $1 \times 10^{15}$ | Substantially Transparent | >98% | 1.06 | $10 \leq A < 50$ |
| 11 | Helium Ions | 200 | $1 \times 10^{15}$ | Transparent | ~100% | 1.06 | $10 \leq A < 50$ |
| 12 | Carbon Ions | 200 | $1 \times 10^{15}$ | Substantially Transparent | >98% | 1.06 | $10 \leq A < 50$ |
| 13 | Hydrogen Molecule Ions | 200 | $1 \times 10^{15}$ | Transparent | ~100% | 1.06 | $10 \leq A < 50$ |
| 14 | Argon Ions | 200 | $1 \times 10^{15}$ | Substantially Transparent | >98% | 1.06 | $10 \leq A < 50$ |
| 15 | Hydrogen Ions | 200 | $1 \times 10^{15}$ | Transparent | ~100% | 1.06 | $50 \leq A \leq 500$ |
| 16 | Nitrogen Ions | 200 | $1 \times 10^{15}$ | Substantially Transparent | >98% | 1.06 | $50 \leq A \leq 500$ |
| 17 | Oxygen Ions | 200 | $1 \times 10^{15}$ | Substantially Transparent | >98% | 1.06 | $50 \leq A \leq 500$ |
| 18 | Helium Ions | 200 | $1 \times 10^{15}$ | Transparent | ~100% | 1.06 | $50 \leq A \leq 500$ |
| 19 | Carbon Ions | 200 | $1 \times 10^{15}$ | Substantially Transparent | >98% | 1.06 | $50 \leq A \leq 500$ |
| 20 | Hydrogen Molecule Ions | 200 | $1 \times 10^{15}$ | Transparent | ~100% | 1.06 | $50 \leq A \leq 500$ |
| 21 | Argon Ions | 200 | $1 \times 10^{15}$ | Substantially Transparent | >98% | 1.06 | $50 \leq A \leq 500$ |
| 22 | Hydrogen Ions | 200 | $1 \times 10^{16}$ | Transparent | ~100% | 0.53 | 5 |
| 23 | Nitrogen Ions | 200 | $1 \times 10^{16}$ | Substantially Transparent | >95% | 0.53 | 5 |
| 24 | Oxygen Ions | 200 | $1 \times 10^{16}$ | Substantially Transparent | >95% | 0.53 | 5 |
| 25 | Helium Ions | 200 | $1 \times 10^{16}$ | Transparent | ~100% | 0.53 | 5 |
| 26 | Carbon Ions | 200 | $1 \times 10^{16}$ | Substantially Transparent | >95% | 0.53 | 5 |
| 27 | Hydrogen Molecule Ions | 200 | $1 \times 10^{16}$ | Transparent | ~100% | 0.53 | 5 |
| 28 | Argon Ions | 200 | $1 \times 10^{16}$ | Substantially Transparent | >95% | 0.53 | 5 |
| 29 | Hydrogen Ions | 200 | $1 \times 10^{15}$ | Transparent | ~100% | 10.6 | 2500 |
| 30 | Nitrogen Ions | 200 | $1 \times 10^{15}$ | Substantially Transparent | >98% | 10.6 | 2500 |
| 31 | Oxygen Ions | 200 | $1 \times 10^{15}$ | Substantially Transparent | >98% | 10.6 | 2500 |
| 32 | Helium Ions | 200 | $1 \times 10^{15}$ | Transparent | ~100% | 10.6 | 2500 |

TABLE 1-continued

| | | | | | | | |
|---|---|---|---|---|---|---|---|
| 33 | Carbon Ions | 200 | $1 \times 10^{15}$ | Substantially Transparent | >98% | 10.6 | 2500 |
| 34 | Hydrogen Molecule Ions | 200 | $1 \times 10^{15}$ | Transparent | ~100% | 10.6 | 2500 |
| 35 | Argon Ions | 200 | $1 \times 10^{15}$ | Substantially Transparent | >98% | 10.6 | 2500 |

| | Laser Beam Irradiation Conditions | | | | Time Period for |
|---|---|---|---|---|---|
| Specimen | Pulse Interval (μsec) | Pulse Width (nsec) | Diameter of Condensed Light (μm) | Irradiation Fluence (mJ/mm$^2$) | Separation (in Air at Room Temperature) (Min.) |
| 1-1 | 40 | 10 | 30 | 1410 | 11 |
| 1-2 | 40 | 10 | 30 | 1410 | 7 |
| 2 | 40 | 10 | 30 | 1410 | 28 |
| 3 | 40 | 10 | 30 | 1410 | 15 |
| 4 | 40 | 10 | 30 | 1410 | 7 |
| 5 | 40 | 10 | 30 | 1410 | 29 |
| 6 | 40 | 10 | 30 | 1410 | 7 |
| 7 | 40 | 10 | 30 | 1410 | 9 |
| 8 | 40 | 10 | 70 | 7800 | 1 |
| 9 | 40 | 10 | 70 | 7800 | 8 |
| 10 | 40 | 10 | 70 | 7800 | 2 |
| 11 | 40 | 10 | 70 | 7800 | 1.8 |
| 12 | 40 | 10 | 70 | 7800 | 10 |
| 13 | 40 | 10 | 70 | 7800 | 1 |
| 14 | 40 | 10 | 70 | 7800 | 1.5 |
| 15 | 40 | 10 | 300 | 2830 | 1.1 |
| 16 | 40 | 10 | 300 | 2830 | 9 |
| 17 | 40 | 10 | 300 | 2830 | 2 |
| 18 | 40 | 10 | 300 | 2830 | 1.5 |
| 19 | 40 | 10 | 300 | 2830 | 15 |
| 20 | 40 | 10 | 300 | 2830 | 1 |
| 21 | 40 | 10 | 300 | 2830 | 2 |
| 22 | 40 | 10 | 30 | 7070 | 9 |
| 23 | 40 | 10 | 30 | 7070 | 50 |
| 24 | 40 | 10 | 30 | 7070 | 18 |
| 25 | 40 | 10 | 30 | 7070 | 9 |
| 26 | 40 | 10 | 30 | 7070 | 90 |
| 27 | 40 | 10 | 30 | 7070 | 10 |
| 28 | 40 | 10 | 30 | 7070 | 11 |
| 29 | 3000 | 50 | 550 | 10520 | 0.5 |
| 30 | 3000 | 50 | 550 | 10520 | 3 |
| 31 | 3000 | 50 | 550 | 10520 | 1.2 |
| 32 | 3000 | 50 | 550 | 10520 | 0.4 |
| 33 | 3000 | 50 | 550 | 10520 | 5 |
| 34 | 3000 | 50 | 550 | 10520 | 0.4 |
| 35 | 3000 | 50 | 550 | 10520 | 0.8 |

(Evaluation)

Obtained seed substrate 1b and semiconductor substrate 5 including seed substrate 1a and the diamond layer (semiconductor layer 3) were evaluated under criteria below.

A: As a result of observation at ×20 with a common optical microscope, no crack was generated in seed substrates 1a and 1b and the diamond layer (semiconductor layer 3) and the separation plane had surface roughness (Ra) of Ra≤10 μm.

B: No crack was generated in substrates 1a and 1b and the diamond layer (semiconductor layer 3) and the separation plane had surface roughness (Ra) of 1 μm<Ra<10 μm.

C: A crack was generated in at least any of substrates 1a and 1b and the diamond layer (semiconductor layer 3) or the separation plane had surface roughness (Ra) of Ra≥10 μm.

Generation of a crack was observed at ×20 of the common optical microscope. Surface roughness was determined with a three-dimensional profiler (model name: NEW VIEW 200, manufactured by Zygo Corporation) of an optical microscope based on principles of white-light interferometry.

(Results)

Specimens in which laser was emitted in air at a room temperature were determined as B and specimens in which laser was emitted in cooled air, in pure water, and in the oil were determined as A. Table 2 summarizes results.

TABLE 2

| | | Specimen | | | | | | | | | | | | | | | | |
|---|---|---|---|---|---|---|---|---|---|---|---|---|---|---|---|---|---|---|
| | | 1-1 | 1-2 | 2 | 3 | 4 | 5 | 6 | 7 | 8 | 9 | 10 | 11 | 12 | 13 | 14 | 15 | 16 | 17 |
| Laser Irradiation Environment | Air at Room Temperature (25° C.) | B | B | B | B | B | B | B | B | B | B | B | B | B | B | B | C | C | C |
| | Cooled Air (−5° C.) | A | A | B | B | A | B | A | A | A | B | A | B | A | A | B | B | B | B |

TABLE 2-continued

| | | | | | | | | | | | | | | | | | |
|---|---|---|---|---|---|---|---|---|---|---|---|---|---|---|---|---|---|
| Pure Water (25° C.) | A | A | B | A | A | B | A | A | A | B | A | A | B | A | A | A | B | B |
| Engine Oil (25° C.) | A | A | A | A | A | A | A | A | A | A | A | A | A | A | A | A | B | A |

| | | Specimen | | | | | | | | | | | | | | | | |
|---|---|---|---|---|---|---|---|---|---|---|---|---|---|---|---|---|---|---|
| | | 18 | 19 | 20 | 21 | 22 | 23 | 24 | 25 | 26 | 27 | 28 | 29 | 30 | 31 | 32 | 33 | 34 | 35 |
| Laser Irradiation Environment | Air at Room Temperature (25° C.) | C | C | C | C | B | B | B | B | B | B | B | B | B | B | B | B | B | B |
| | Cooled Air (−5° C.) | B | C | B | B | A | B | B | A | B | A | A | A | B | B | A | B | A | A |
| | Pure Water (25° C.) | A | B | A | A | A | B | A | A | B | A | A | A | A | A | A | A | A | A |
| | Engine Oil (25° C.) | A | B | A | A | A | A | A | A | A | A | A | A | A | A | A | A | A | A |

The separated front surface of the sample determined as A was observed with SIMS. Then, hydrogen element in an amount clearly greater than in a bulk could be confirmed. The separated front surface of the sample determined as B was observed with SIMS. Then, hydrogen element in an amount clearly greater than in a bulk could be confirmed. The front surface was further analyzed with XPS. Then, not only carbon element achieving sp$^3$ bond but also carbon element achieving sp$^2$ bond could be confirmed.

Specimens manufactured with the same procedure as those for specimen 1-1 and specimen 1-2 were irradiated in pure water at a room temperature with laser beams at pulse widths of 0.02 psec., 1 psec., and 10 psec., at a pulse interval of 1 msec. (a repetition frequency of 1 kHz), and at pulse energy of 0.01 μJ, 0.03 μJ, and 0.06 μJ. Results of determination were the same for both of specimen 1-1 and specimen 1-2. Under the condition of 0.02 psec. and the condition of 1 psec., determination as C was made in evaluation described previously, and under the condition of 10 psec., determination as B was made. Energy for cutting bond was high, and therefore it was difficult to obtain determination A. Even under such conditions for irradiation with laser beams, the diamond layer could be separated from the seed substrate.

[Specimen 2 to Specimen 35]

In specimen 2 to specimen 35, semiconductor substrate 5 and seed substrate 1*b* were separated from each other with the method the same as that for specimen 1-1, except that a type of implanted ions in ion implantation, a dose for the ion implanted layer, and conditions for irradiation with laser beams were set as shown in Tables 1 and 2. In specimens 11, 25, and 32, the side of the main surface of seed substrate 1 was irradiated with laser beams instead of the side of the main surface of the diamond layer (semiconductor layer 3). Table 1 shows a time period required for separation in air at a room temperature.

Obtained seed substrate 1*b* and semiconductor substrate 5 including seed substrate 1*a* and the diamond layer (semiconductor layer 3) were evaluated under the criteria the same as those for specimen 1-1.

Specimens in which laser was emitted in air at a room temperature were determined as B or C and specimens in which laser was emitted in cooled air, in an aqueous solution, and in the oil were determined as A or B except for specimen 19 in which irradiation was performed in cooled air. Table 2 summarizes results.

The separated front surface of the sample determined as A was observed with SIMS. Then, an implanted element in an amount clearly greater than in a bulk could be confirmed, except for samples in which carbon ions were implanted. The separated front surface of the sample determined as B was also observed with SIMS. Then, an implanted element in an amount greater than in a bulk could be confirmed, except for samples in which carbon ions were implanted. The front surface was further analyzed with XPS. Then, not only carbon element achieving sp$^3$ bond but also carbon element achieving sp$^2$ bond could be confirmed, with samples in which carbon ions were implanted being also included. The separated front surface of the sample determined as C was observed with SIMS. Then, an implanted element in an amount greater than in a bulk could be confirmed. In analysis with XPS, presence of carbon element achieving sp$^2$ bond and the carbon element forming at least one substantially circular pattern having a diameter not smaller than 30 μm could be confirmed. Surface roughness was evaluated with a three-dimensional profiler and it could be confirmed that a portion of the substantially circular pattern was recessed. When at least two such substantially circular patterns could be confirmed, they were linearly aligned. The linear direction matched with the direction of scanning by laser in separation. The substantially circular pattern herein does not mean a perfect circle but refers to a circle having at least ⅕ arc of a circle at least having a perfect contour. The circle encompasses not only a precise circle but also an elliptical shape.

Example 2

In Example 2, the method for manufacturing a semiconductor substrate according to the first embodiment was reviewed.

[Specimen 36]

(Preparation of Seed Substrate, Formation of Ion Implanted Layer, and Formation of Diamond Layer)

Seed substrate 1 as in specimen 1-1 was prepared and ion implanted layer 2 and the diamond layer (semiconductor layer 3) were formed with the method the same as that for specimen 1-1. In a sample of specimen 36, a light transmittance (T1) of seed substrate 1, a light transmittance (T2) of ion implanted layer 2, and a light transmittance (T3) of the diamond layer (semiconductor layer 3) were measured with a common spectrophotometer in ultraviolet, visible, and near infrared regions. A ratio (T2/T1) between the light transmittance (Ti) of the substrate and the light transmittance (T2) of the ion implanted layer for light having a wavelength of 800 nm was not lower than 99%. A ratio (T2/T3) between the light transmittance (T2) of the ion implanted layer and the light transmittance (T3) of the diamond layer for the light having a wavelength of 800 nm was not lower than 99%.

(Separation of Diamond Layer)

Then, the front surface of the main surface of the diamond layer (semiconductor layer 3) was irradiated with light from a flash lamp. The light was from a xenon flash lamp and condensed to a diameter of 5 mm. Light having a wavelength shorter than 500 nm and exceeding 1.25 μm was cut off, and light having a wavelength not shorter than 500 nm and not longer than 1.25 μm was selectively used. The light from the flash lamp was emitted as being physically cut off to achieve a pulse interval of 8 msec., a pulse width of 1 μsec. and a diameter of 1 mm at the front surface of the main surface and as further being condensed to 0.1 mm. A focus of the light from the flash lamp was located in ion implanted layer 2. A speed of scanning by the light from the flash lamp (actually, it was the sample that was moved) was set to 10 mm/second. A pulse output (A) of the light from the flash lamp was varied within a range higher than 3 mJ and lower than 30 mJ. Irradiation fluence per pulse width of 1 msec. at the front surface of the main surface of the diamond layer (semiconductor layer 3) was set to 1900 mJ/mm². The light from the flash lamp was emitted in any selected condition from among air at a room temperature (25° C.), cooled air (−5° C.), pure water (25° C.), and a commercially available engine oil (25° C.). Seed substrate 1b was separated from semiconductor substrate 5 including the diamond layer (semiconductor layer 3) and seed substrate 1a. A time period required for separation in air at a room temperature was 14 minutes.

TABLE 3

| Specimen | Type of Implanted Ions | Ion Implanted Layer Energy (keV) | Ion Implanted Layer Dose (cm⁻²) | Light Transmittance (@800 nm) Visually Recognized Ion Implanted Layer | Light Transmittance (@800 nm) T2/T3 (%) | Flash Lamp Irradiation Conditions Pulse Energy A (mJ) | Flash Lamp Irradiation Conditions Pulse Interval (msec) |
|---|---|---|---|---|---|---|---|
| 36 | Hydrogen Ions | 200 | $1 \times 10^{16}$ | Transparent | ~100% | 3 < A < 30 | 8 |
| 37 | Nitrogen Ions | 200 | $1 \times 10^{16}$ | Substantially Transparent | >95% | 3 < A < 30 | 8 |
| 38 | Oxygen Ions | 200 | $1 \times 10^{16}$ | Substantially Transparent | >95% | 3 < A < 30 | 8 |
| 39 | Helium Ions | 200 | $1 \times 10^{16}$ | Transparent | ~100% | 3 < A < 30 | 8 |
| 40 | Carbon Ions | 200 | $1 \times 10^{16}$ | Substantially Transparent | >95% | 3 < A < 30 | 8 |
| 41 | Hydrogen Molecule Ions | 200 | $1 \times 10^{16}$ | Transparent | ~100% | 3 < A < 30 | 8 |
| 42 | Argon Ions | 200 | $1 \times 10^{16}$ | Substantially Transparent | >95% | 3 < A < 30 | 8 |
| 43 | Hydrogen Ions | 200 | $1 \times 10^{15}$ | Transparent | ~100% | 30 ≤ A < 300 | 8 |
| 44 | Nitrogen Ions | 200 | $1 \times 10^{15}$ | Substantially Transparent | >98% | 30 ≤ A < 300 | 8 |
| 45 | Oxygen Ions | 200 | $1 \times 10^{15}$ | Substantially Transparent | >98% | 30 ≤ A < 300 | 8 |
| 46 | Helium Ions | 200 | $1 \times 10^{15}$ | Transparent | ~100% | 30 ≤ A < 300 | 8 |
| 47 | Carbon Ions | 200 | $1 \times 10^{15}$ | Substantially Transparent | >98% | 30 ≤ A < 300 | 8 |
| 48 | Hydrogen Molecule Ions | 200 | $1 \times 10^{15}$ | Transparent | ~100% | 30 ≤ A < 300 | 8 |
| 49 | Argon Ions | 200 | $1 \times 10^{15}$ | Substantially Transparent | >98% | 30 ≤ A < 300 | 8 |

| Specimen | Flash Lamp Irradiation Conditions Pulse Width (μsec) | Flash Lamp Irradiation Conditions Diameter of Condensed Light (mm) | Flash Lamp Irradiation Conditions Irradiation Fluence (mJ/mm²) | Time Period for Separation (in Air at Room Temperature) (Min.) |
|---|---|---|---|---|
| 36 | 1 | 0.1 | 1900 | 14 |
| 37 | 1 | 0.1 | 1900 | 28 |
| 38 | 1 | 0.1 | 1900 | 20 |
| 39 | 1 | 0.1 | 1900 | 18 |
| 40 | 1 | 0.1 | 1900 | 70 |
| 41 | 1 | 0.1 | 1900 | 20 |
| 42 | 1 | 0.1 | 1900 | 30 |
| 43 | 1 | 1 | 300 | 80 |
| 44 | 1 | 1 | 300 | 150 |
| 45 | 1 | 1 | 300 | 80 |
| 46 | 1 | 1 | 300 | 70 |
| 47 | 1 | 1 | 300 | 300 |
| 48 | 1 | 1 | 300 | 80 |
| 49 | 1 | 1 | 300 | 90 |

(Evaluation)

Obtained seed substrate 1b and semiconductor substrate 5 including seed substrate 1a and the diamond layer (semiconductor layer 3) were evaluated under the criteria the same as in Example 1.

(Results)

Specimens in which light from the flash lamp was emitted in air at a room temperature were determined as B and specimens in which the light was emitted in cooled air, in pure water, and in the oil were determined as A. Table 4 shows results.

TABLE 4

| | | Specimen | | | | | | | | | | | | |
|---|---|---|---|---|---|---|---|---|---|---|---|---|---|---|
| | | 36 | 37 | 38 | 39 | 40 | 41 | 42 | 43 | 44 | 45 | 46 | 47 | 48 | 49 |
| Laser Irradiation Environment | Air at Room Temperature (25° C.) | B | C | C | B | C | B | B | B | C | C | B | C | B | B |
| | Cooled Air (−5° C.) | A | B | B | A | B | A | A | A | B | B | A | B | A | A |
| | Pure Water (25° C.) | A | B | B | A | B | A | A | A | B | B | A | B | A | A |
| | Engine Oil (25° C.) | A | A | A | A | A | A | A | A | A | A | A | A | A | A |

The separated front surface of the sample determined as A was observed with SIMS. Then, hydrogen element in an amount clearly greater than in a bulk could be confirmed. The separated front surface of the sample determined as B was observed with SIMS. Then, hydrogen element in an amount clearly greater than in a bulk could be confirmed. The front surface was further analyzed with XPS. Then, not only carbon element achieving $sp^3$ bond but also carbon element achieving $sp^2$ bond could be confirmed.

[Specimen 37 to Specimen 49]

(Fabrication of Specimen)

In specimen 37 to specimen 49, semiconductor substrate 5 and seed substrate 1b were separated from each other with the method the same as that for specimen 36 except that a type of implanted ions in ion implantation, a dose for the ion implanted layer, and conditions for irradiation with light from the flash lamp were set as shown in Table 3. Table 3 shows a time period required for separation in air at a room temperature.

(Evaluation)

The obtained substrate and the diamond layer were evaluated under the criteria the same as in Example 1. Table 4 summarizes results.

(Results)

Specimens in which light from the flash lamp was emitted in air at a room temperature were determined as B or C, specimens in which the light was emitted in cooled air and in pure water were determined as A or B, and specimens in which the light was emitted in the oil were determined as A.

The separated front surface of the sample determined as A was observed with SIMS. Then, an implanted element in an amount greater than in a bulk could be confirmed except for an example in which carbon ions were implanted. At the separated front surface of the sample determined as B as well, an implanted element in an amount greater than in a bulk could be confirmed with SIMS except for samples in which carbon ions were implanted. The front surface was further analyzed with XPS. Then, not only carbon element achieving $sp^3$ bond but also carbon element achieving $sp^2$ bond could be confirmed. At the separated front surface of the sample determined as C, an implanted element in an amount greater than in a bulk could be confirmed with SIMS. In analysis with XPS, presence of carbon element achieving $sp^2$ bond and the carbon element forming at least one substantially circular pattern having a diameter not smaller than 30 µm could be confirmed. Surface roughness was evaluated with a three-dimensional profiler and it could be confirmed that a portion of the substantially circular pattern was recessed. When at least two such substantially circular patterns could be confirmed, they were linearly aligned. The linear direction matched with the direction of scanning by laser in division.

Example 3

In Example 3, the method for manufacturing a semiconductor substrate according to the first embodiment was reviewed.

[Specimens 101-1, 101-2, 201-1, 201-2, 301-1, 301-2, 401-1, and 401-2]

(Preparation of Seed Substrate)

Initially, seed substrates 1 formed from semiconductor substrates of gallium nitride substrates (specimens 101-1 and 101-2), aluminum nitride substrates (specimens 201-1 and 201-2), zinc selenide substrates (specimens 301-1 and 301-2), and silicon carbide substrates (specimens 401-1 and 401-2) each having a size of 20 mm×20 mm and a thickness of 2 mm were prepared. After a front surface of seed substrate 1 was mechanically polished, the front surface of seed substrate 1 was etched to a thickness of 3 to 5 µm with heat or plasma or chemical treatment suited for each seed substrate 1.

(Formation of Ion Implanted Layer)

Then, ion implanted layer 2 was formed by implanting hydrogen ions through the main surface of seed substrate 1. Implantation energy was set to 200 keV and a dose was set to $7\times10^{15}/cm^2$ (specimens 101-1, 201-1, 301-1, and 401-1) or $7\times10^{16}/cm^2$ [specimens 101-2, 201-2, 301-2, and 401-2). A depth of ion implanted layer 2 from the front surface of the main surface of seed substrate 1 could substantially accurately be simulated and it was not greater than 1 µm and ion implanted layer 2 had a thickness not greater than 0.5 µm.

(Formation of Semiconductor Layer)

Then, semiconductor layer 3 was grown on a surface into which ions had been implanted, of seed substrate 1 where ion implanted layer 2 had been formed. Formation of semiconductor layer 3 will be described below for each type of semiconductor layer 3.

When semiconductor layer 3 was formed from a gallium nitride layer, the gallium nitride layer was grown with MOCVD. Initially, seed substrate 1 composed of gallium nitride and having the (0001) plane as the main surface was set in a furnace, a temperature of seed substrate 1 in the furnace was increased to 1030° C., a trimethyl gallium gas, an ammonia gas, and a hydrogen gas as a carrier gas were introduced, and a gallium nitride layer (semiconductor layer 3) was epitaxially grown on the main surface of seed substrate 1. A ratio of mixing between the trimethyl gallium gas and the ammonia gas based on a volume was set to 1:2000. Consequently, the gallium nitride layer (semiconductor layer 3) could epitaxially be grown on seed substrate 1 formed from the gallium nitride substrate to a thickness of 0.8 mm.

When semiconductor layer 3 was formed from an aluminum nitride layer, the aluminum nitride layer was grown with a sublimation method. Initially, seed substrate 1 composed of aluminum nitride and having the (0001) plane as the main surface was set in a furnace, a temperature of seed substrate 1 in the furnace was held at 2000° C., an aluminum nitride source material was sublimated at 2380° C., and the aluminum nitride layer (semiconductor layer 3) was epitaxially grown on the main surface of seed substrate 1 to a thickness of 1 mm.

When semiconductor layer 3 was composed of zinc selenide, a zinc selenide layer was synthesized with the sublimation method. Initially, seed substrate 1 composed of zinc selenide and having the (111) plane as the main surface was set in a furnace, a temperature of seed substrate 1 in the furnace was held at 1100° C., selenium and zinc obtained by decomposing a polycrystalline zinc selenide source material at approximately 1130° C. were introduced into an apparatus with an inert gas being used as a carrier gas, and a zinc selenide layer 3 was epitaxially grown on the main surface of seed substrate 1.

When semiconductor layer 3 was composed of silicon carbide, a silicon carbide layer was grown with the use of an atmospheric pressure horizontal cold wall CVD apparatus. Initially, seed substrate 1 angled off by 2° relative to the (0001) plane of a 4C-SiC substrate was set in a furnace and a temperature of seed substrate 1 in the furnace was set to 1500° C. through high-frequency heating. A monosilane gas, a propane gas, and a hydrogen gas as a carrier gas were introduced and a silicon carbide layer 3 was epitaxially grown on the main surface of seed substrate 1. A ratio of mixing between the monosilane gas and the propane gas based on a volume was set to 1.5:1.

A light transmittance (T1) of seed substrate 1, a light transmittance (T2) of ion implanted layer 2, and a light transmittance (T3) of each semiconductor layer 3 were measured with a common spectrophotometer in ultraviolet, visible, and near infrared regions. A ratio (T2/T1) between the light transmittance (T1) of seed substrate 1 and the light transmittance (T2) of ion implanted layer 2 for light having a wavelength of 800 nm exceeded 90%. A ratio (T2/T3) between the light transmittance (T2) of the ion implanted layer and the light transmittance (T3) of the semiconductor layer for the light having a wavelength of 800 nm exceeded 90%.

(Separation of Semiconductor Substrate)

Then, the front surface of the main surface of semiconductor layer 3 was irradiated with YAG laser beams having a wavelength of 1.06 μm. The laser beams were emitted at a pulse interval of 40 μsec. and a pulse width of 10 nsec. as being condensed to a diameter of 30 μm at the front surface of the main surface. A focus of the laser beams was located in a light absorptive layer. A speed of scanning by the laser beams was set to 25 mm/second. Pulse energy (A) of the laser beams was selected from a range not lower than 0.01 mJ and not higher than 10 mJ. Irradiation fluence per pulse at the front surface of the main surface of the semiconductor layer was set to 1410 mJ/mm². The laser beams were emitted in any selected condition of air at a room temperature (25° C.), cooled air (−5° C.), pure water (25° C.), and a commercially available engine oil (25° C.). Consequently, the substrate and the semiconductor layer were separated from each other.

TABLE 5

| | | Ion Implanted Layer | | Light Transmittance (@800 nm) | | Laser Beam Irradiation Conditions | |
| --- | --- | --- | --- | --- | --- | --- | --- |
| Specimen | Type of Implanted Ions | Energy (keV) | Dose (cm$^{-2}$) | Visually Recognized Ion Implanted Layer | T2/T3 (%) | Wavelength (μm) | Pulse Energy A (mJ) |
| 101-1 | Hydrogen Ions | 200 | $7 \times 10^{15}$ | Substantially Transparent | >98% | 1.06 | $0.01 \leq A < 10$ |
| 101-2 | Hydrogen Ions | 200 | $7 \times 10^{16}$ | Transparent, Slightly Shaded | >90% | 1.06 | $0.01 \leq A < 10$ |
| 102 | Helium Ions | 200 | $7 \times 10^{16}$ | Transparent, Slightly Shaded | >90% | 1.06 | $0.01 \leq A < 10$ |
| 103 | Hydrogen Molecule Ions | 200 | $7 \times 10^{16}$ | Transparent, Slightly Shaded | >90% | 1.06 | $0.01 \leq A < 10$ |
| 104 | Argon Ions | 200 | $7 \times 10^{16}$ | Transparent, Slightly Shaded | >90% | 1.06 | $0.01 \leq A < 10$ |
| 105 | Hydrogen Ions | 200 | $1 \times 10^{16}$ | Substantially Transparent | >98% | 1.06 | $10 \leq A < 50$ |
| 106 | Helium Ions | 200 | $1 \times 10^{16}$ | Substantially Transparent | >98% | 1.06 | $10 \leq A < 50$ |
| 107 | Hydrogen Molecule Ions | 200 | $1 \times 10^{16}$ | Substantially Transparent | >98% | 1.06 | $10 \leq A < 50$ |
| 108 | Argon Ions | 200 | $1 \times 10^{16}$ | Substantially Transparent | >98% | 1.06 | $10 \leq A < 50$ |
| 109 | Hydrogen Ions | 200 | $3 \times 10^{16}$ | Substantially Transparent | >98% | 1.06 | $50 \leq A < 500$ |
| 110 | Helium Ions | 200 | $3 \times 10^{16}$ | Substantially Transparent | >98% | 1.06 | $50 \leq A < 500$ |
| 111 | Hydrogen Molecule Ions | 200 | $3 \times 10^{16}$ | Substantially Transparent | >98% | 1.06 | $50 \leq A \leq 500$ |
| 112 | Argon Ions | 200 | $3 \times 10^{16}$ | Transparent, Slightly Shaded | >95% | 1.06 | $50 \leq A \leq 500$ |
| 113 | Hydrogen Ions | 200 | $1 \times 10^{16}$ | Substantially Transparent | >98% | 0.53 | 5 |
| 114 | Helium Ions | 200 | $1 \times 10^{16}$ | Substantially Transparent | >98% | 0.53 | 5 |
| 115 | Hydrogen Molecule Ions | 200 | $1 \times 10^{16}$ | Substantially Transparent | >98% | 0.53 | 5 |
| 116 | Argon Ions | 200 | $1 \times 10^{16}$ | Substantially Transparent | >98% | 0.53 | 5 |
| 117 | Hydrogen Ions | 200 | $1 \times 10^{16}$ | Substantially Transparent | >98% | 10.6 | 2500 |

TABLE 5-continued

| | | | | | | | |
|---|---|---|---|---|---|---|---|
| 118 | Helium Ions | 200 | $1 \times 10^{16}$ | Substantially Transparent | >98% | 10.6 | 2500 |
| 119 | Hydrogen Molecule Ions | 200 | $1 \times 10^{16}$ | Substantially Transparent | >98% | 10.6 | 2500 |
| 120 | Argon Ions | 200 | $1 \times 10^{16}$ | Substantially Transparent | >98% | 10.6 | 2500 |

| | Laser Beam Irradiation Conditions | | | | Time Period for Separation in Air at Room Temperature (Min.) |
|---|---|---|---|---|---|
| Specimen | Pulse Interval (μsec) | Pulse Width (nsec) | Diameter of Condensed Light (μm) | Irradiation Fluence (mJ/mm²) | |
| 101-1 | 40 | 10 | 30 | 1410 | 98 |
| 101-2 | 40 | 10 | 30 | 1410 | 68 |
| 102 | 40 | 10 | 30 | 1410 | 62 |
| 103 | 40 | 10 | 30 | 1410 | 53 |
| 104 | 40 | 10 | 30 | 1410 | 75 |
| 105 | 40 | 10 | 70 | 7800 | 53 |
| 106 | 40 | 10 | 70 | 7800 | 45 |
| 107 | 40 | 10 | 70 | 7800 | 40 |
| 108 | 40 | 10 | 70 | 7800 | 55 |
| 109 | 40 | 10 | 300 | 2830 | 25 |
| 110 | 40 | 10 | 300 | 2830 | 20 |
| 111 | 40 | 10 | 300 | 2830 | 17 |
| 112 | 40 | 10 | 300 | 2830 | 28 |
| 113 | 40 | 10 | 30 | 7070 | 61 |
| 114 | 40 | 10 | 30 | 7070 | 53 |
| 115 | 40 | 10 | 30 | 7070 | 50 |
| 116 | 40 | 10 | 30 | 7070 | 64 |
| 117 | 3000 | 50 | 550 | 10520 | 18 |
| 118 | 3000 | 50 | 550 | 10520 | 16 |
| 119 | 3000 | 50 | 550 | 10520 | 14 |
| 120 | 3000 | 50 | 550 | 10520 | 21 |

TABLE 6

| | Ion Implanted Layer | | | Light Transmittance (@800 nm) | | Laser Beam Irradiation Conditions | |
|---|---|---|---|---|---|---|---|
| Specimen | Type of Implanted Ions | Energy (keV) | Dose (cm⁻²) | Visually Recognized Ion Implanted Layer | in Air at Room Temperature (Min.) | Wavelength (μm) | Pulse Energy A (mJ) |
| 201-1 | Hydrogen Ions | 200 | $7 \times 10^{15}$ | Substantially Transparent | >98% | 1.06 | $0.01 \leq A < 10$ |
| 201-2 | Hydrogen Ions | 200 | $7 \times 10^{16}$ | Transparent, Slightly Shaded | >90% | 1.06 | $0.01 \leq A < 10$ |
| 202 | Helium Ions | 200 | $7 \times 10^{16}$ | Transparent, Slightly Shaded | >90% | 1.06 | $0.01 \leq A < 10$ |
| 203 | Hydrogen Molecule Ions | 200 | $7 \times 10^{16}$ | Transparent, Slightly Shaded | >90% | 1.06 | $0.01 \leq A < 10$ |
| 204 | Argon Ions | 200 | $7 \times 10^{16}$ | Transparent, Slightly Shaded | >90% | 1.06 | $0.01 \leq A < 10$ |
| 205 | Hydrogen Ions | 200 | $1 \times 10^{16}$ | Substantially Transparent | >98% | 1.06 | $10 \leq A < 50$ |
| 206 | Helium Ions | 200 | $1 \times 10^{16}$ | Substantially Transparent | >98% | 1.06 | $10 \leq A < 50$ |
| 207 | Hydrogen Molecule Ions | 200 | $1 \times 10^{16}$ | Substantially Transparent | >98% | 1.06 | $10 \leq A < 50$ |
| 208 | Argon Ions | 200 | $1 \times 10^{16}$ | Substantially Transparent | >98% | 1.06 | $10 \leq A < 50$ |
| 209 | Hydrogen Ions | 200 | $3 \times 10^{16}$ | Substantially Transparent | >98% | 1.06 | $50 \leq A \leq 500$ |
| 210 | Helium Ions | 200 | $3 \times 10^{16}$ | Substantially Transparent | >98% | 1.06 | $50 \leq A \leq 500$ |
| 211 | Hydrogen Molecule Ions | 200 | $3 \times 10^{16}$ | Substantially Transparent | >98% | 1.06 | $50 \leq A \leq 500$ |
| 212 | Argon Ions | 200 | $3 \times 10^{16}$ | Transparent, Slightly Shaded | >95% | 1.06 | $50 \leq A \leq 500$ |
| 213 | Hydrogen Ions | 200 | $1 \times 10^{16}$ | Substantially Transparent | >98% | 0.53 | 5 |
| 214 | Helium Ions | 200 | $1 \times 10^{16}$ | Substantially Transparent | >98% | 0.53 | 5 |
| 215 | Hydrogen Molecule Ions | 200 | $1 \times 10^{16}$ | Substantially Transparent | >98% | 0.53 | 5 |
| 216 | Argon Ions | 200 | $1 \times 10^{16}$ | Substantially Transparent | >98% | 0.53 | 5 |

TABLE 6-continued

| | | | | | | | |
|---|---|---|---|---|---|---|---|
| 217 | Hydrogen Ions | 200 | $1 \times 10^{16}$ | Substantially Transparent | >98% | 10.6 | 2500 |
| 218 | Helium Ions | 200 | $1 \times 10^{16}$ | Substantially Transparent | >98% | 10.6 | 2500 |
| 219 | Hydrogen Molecule Ions | 200 | $1 \times 10^{16}$ | Substantially Transparent | >98% | 10.6 | 2500 |
| 220 | Argon Ions | 200 | $1 \times 10^{16}$ | Substantially Transparent | >98% | 10.6 | 2500 |

| | Laser Beam Irradiation Conditions | | | | Time Period for |
|---|---|---|---|---|---|
| Specimen | Pulse Interval (µsec) | Pulse Width (nsec) | Diameter of Condensed Light (µm) | Irradiation Fluence (mJ/mm$^2$) | Separation in Air at Room Temperature (Min.) |
| 201-1 | 40 | 10 | 30 | 1410 | 100 |
| 201-2 | 40 | 10 | 30 | 1410 | 72 |
| 202 | 40 | 10 | 30 | 1410 | 66 |
| 203 | 40 | 10 | 30 | 1410 | 58 |
| 204 | 40 | 10 | 30 | 1410 | 80 |
| 205 | 40 | 10 | 70 | 7800 | 59 |
| 206 | 40 | 10 | 70 | 7800 | 48 |
| 207 | 40 | 10 | 70 | 7800 | 45 |
| 208 | 40 | 10 | 70 | 7800 | 62 |
| 209 | 40 | 10 | 300 | 2830 | 28 |
| 210 | 40 | 10 | 300 | 2830 | 23 |
| 211 | 40 | 10 | 300 | 2830 | 19 |
| 212 | 40 | 10 | 300 | 2830 | 32 |
| 213 | 40 | 10 | 30 | 7070 | 65 |
| 214 | 40 | 10 | 30 | 7070 | 56 |
| 215 | 40 | 10 | 30 | 7070 | 52 |
| 216 | 40 | 10 | 30 | 7070 | 67 |
| 217 | 3000 | 50 | 550 | 10520 | 21 |
| 218 | 3000 | 50 | 550 | 10520 | 18 |
| 219 | 3000 | 50 | 550 | 10520 | 16 |
| 220 | 3000 | 50 | 550 | 10520 | 25 |

TABLE 7

| | Ion Implanted Layer | | | Light Transmittance (@800 nm) | | Laser Beam Irradiation Conditions | |
|---|---|---|---|---|---|---|---|
| Specimen | Type of Implanted Ions | Energy (keV) | Dose (cm$^{-2}$) | Visually Recognized Ion Implanted Layer | T2/T3 (%) | Wavelength (µm) | Pulse Energy A (mJ) |
| 301-1 | Hydrogen Ions | 200 | $7 \times 10^{15}$ | Substantially Transparent | >98% | 1.06 | 0.01 ≤ A < 10 |
| 301-2 | Hydrogen Ions | 200 | $7 \times 10^{16}$ | Transparent, Slightly Shaded | >90% | 1.06 | 0.01 ≤ A < 10 |
| 302 | Helium Ions | 200 | $7 \times 10^{16}$ | Transparent, Slightly Shaded | >90% | 1.06 | 0.01 ≤ A < 10 |
| 303 | Hydrogen Molecule Ions | 200 | $7 \times 10^{16}$ | Transparent, Slightly Shaded | >90% | 1.06 | 0.01 ≤ A < 10 |
| 304 | Argon Ions | 200 | $7 \times 10^{16}$ | Transparent, Slightly Shaded | >90% | 1.06 | 0.01 ≤ A < 10 |
| 305 | Hydrogen Ions | 200 | $1 \times 10^{16}$ | Substantially Transparent | >98% | 1.06 | 10 ≤ A < 50 |
| 306 | Helium Ions | 200 | $1 \times 10^{16}$ | Substantially Transparent | >98% | 1.06 | 10 ≤ A < 50 |
| 307 | Hydrogen Molecule Ions | 200 | $1 \times 10^{16}$ | Substantially Transparent | >98% | 1.06 | 10 ≤ A < 50 |
| 308 | Argon Ions | 200 | $1 \times 10^{16}$ | Substantially Transparent | >98% | 1.06 | 10 ≤ A < 50 |
| 309 | Hydrogen Ions | 200 | $3 \times 10^{16}$ | Substantially Transparent | >98% | 1.06 | 50 ≤ A ≤ 500 |
| 310 | Helium Ions | 200 | $3 \times 10^{16}$ | Substantially Transparent | >98% | 1.06 | 50 ≤ A ≤ 500 |
| 311 | Hydrogen Molecule Ions | 200 | $3 \times 10^{16}$ | Substantially Transparent | >98% | 1.06 | 50 ≤ A ≤ 500 |
| 312 | Argon Ions | 200 | $3 \times 10^{16}$ | Transparent, Slightly Shaded | >95% | 1.06 | 50 ≤ A ≤ 500 |
| 313 | Hydrogen Ions | 200 | $1 \times 10^{16}$ | Substantially Transparent | >98% | 0.53 | 5 |
| 314 | Helium Ions | 200 | $1 \times 10^{16}$ | Substantially Transparent | >98% | 0.53 | 5 |

TABLE 7-continued

| | | | | | | | |
|---|---|---|---|---|---|---|---|
| 315 | Hydrogen Molecule Ions | 200 | $1 \times 10^{16}$ | Substantially Transparent | >98% | 0.53 | 5 |
| 316 | Argon Ions | 200 | $1 \times 10^{16}$ | Substantially Transparent | >98% | 0.53 | 5 |
| 317 | Hydrogen Ions | 200 | $1 \times 10^{16}$ | Substantially Transparent | >98% | 10.6 | 2500 |
| 318 | Helium Ions | 200 | $1 \times 10^{16}$ | Substantially Transparent | >98% | 10.6 | 2500 |
| 319 | Hydrogen Molecule Ions | 200 | $1 \times 10^{16}$ | Substantially Transparent | >98% | 10.6 | 2500 |
| 320 | Argon Ions | 200 | $1 \times 10^{16}$ | Substantially Transparent | >98% | 10.6 | 2500 |

| | Laser Beam Irradiation Conditions | | | | Time Period for Separation |
|---|---|---|---|---|---|
| Specimen | Pulse Interval (μsec) | Pulse Width (nsec) | Diameter of Condensed Light (μm) | Irradiation Fluence (mJ/mm²) | in Air at Room Temperature (Min.) |
| 301-1 | 40 | 10 | 30 | 1410 | 67 |
| 301-2 | 40 | 10 | 30 | 1410 | 58 |
| 302 | 40 | 10 | 30 | 1410 | 52 |
| 303 | 40 | 10 | 30 | 1410 | 43 |
| 304 | 40 | 10 | 30 | 1410 | 68 |
| 305 | 40 | 10 | 70 | 7800 | 41 |
| 306 | 40 | 10 | 70 | 7800 | 37 |
| 307 | 40 | 10 | 70 | 7800 | 35 |
| 308 | 40 | 10 | 70 | 7800 | 47 |
| 309 | 40 | 10 | 300 | 2830 | 20 |
| 310 | 40 | 10 | 300 | 2830 | 17 |
| 311 | 40 | 10 | 300 | 2830 | 15 |
| 312 | 40 | 10 | 300 | 2830 | 24 |
| 313 | 40 | 10 | 30 | 7070 | 50 |
| 314 | 40 | 10 | 30 | 7070 | 47 |
| 315 | 40 | 10 | 30 | 7070 | 42 |
| 316 | 40 | 10 | 30 | 7070 | 57 |
| 317 | 3000 | 50 | 550 | 10520 | 17 |
| 318 | 3000 | 50 | 550 | 10520 | 14 |
| 319 | 3000 | 50 | 550 | 10520 | 12 |
| 320 | 3000 | 50 | 550 | 10520 | 22 |

TABLE 8

| | Ion Implanted Layer | | Light Transmittance (@800 nm) | | Laser Beam Irradiation Conditions | |
|---|---|---|---|---|---|---|
| Specimen | Type of Implanted Ions | Energy (keV) | Dose (cm⁻²) | Visually Recognized Ion Implanted Layer | T2/T3 (%) | Wavelength (um) | Pulse Energy A (mJ) |
| 401-1 | Hydrogen Ions | 200 | $7 \times 10^{15}$ | Substantially Transparent | >98% | 1.06 | $0.01 \le A < 10$ |
| 401-2 | Hydrogen Ions | 200 | $7 \times 10^{16}$ | Transparent, Slightly Shaded | >90% | 1.06 | $0.01 \le A < 10$ |
| 402 | Helium Ions | 200 | $7 \times 10^{16}$ | Transparent, Slightly Shaded | >90% | 1.06 | $0.01 \le A < 10$ |
| 403 | Hydrogen Molecule Ions | 200 | $7 \times 10^{16}$ | Transparent, Slightly Shaded | >90% | 1.06 | $0.01 \le A < 10$ |
| 404 | Argon Ions | 200 | $7 \times 10^{16}$ | Transparent, Slightly Shaded | >90% | 1.06 | $0.01 \le A < 10$ |
| 405 | Hydrogen Ions | 200 | $1 \times 10^{16}$ | Substantially Transparent | >98% | 1.06 | $10 \le A < 50$ |
| 406 | Helium Ions | 200 | $1 \times 10^{16}$ | Substantially Transparent | >98% | 1.06 | $10 \le A < 50$ |
| 407 | Hydrogen Molecule Ions | 200 | $1 \times 10^{16}$ | Substantially Transparent | >98% | 1.06 | $10 \le A < 50$ |
| 408 | Argon Ions | 200 | $1 \times 10^{16}$ | Substantially Transparent | >98% | 1.06 | $10 \le A < 50$ |
| 409 | Hydrogen Ions | 200 | $3 \times 10^{16}$ | Substantially Transparent | >98% | 1.06 | $50 \le A \le 500$ |
| 410 | Helium Ions | 200 | $3 \times 10^{16}$ | Substantially Transparent | >98% | 1.06 | $50 \le A \le 500$ |
| 411 | Hydrogen Molecule Ions | 200 | $3 \times 10^{16}$ | Substantially Transparent | >98% | 1.06 | $50 \le A \le 500$ |
| 412 | Argon Ions | 200 | $3 \times 10^{16}$ | Transparent, Slightly Shaded | >95% | 1.06 | $50 \le A \le 500$ |
| 413 | Hydrogen Ions | 200 | $1 \times 10^{16}$ | Substantially Transparent | >98% | 0.53 | 5 |
| 414 | Helium Ions | 200 | $1 \times 10^{16}$ | Substantially Transparent | >98% | 0.53 | 5 |
| 415 | Hydrogen Molecule Ions | 200 | $1 \times 10^{16}$ | Substantially Transparent | >98% | 0.53 | 5 |
| 416 | Argon Ions | 200 | $1 \times 10^{16}$ | Substantially Transparent | >98% | 0.53 | 5 |
| 417 | Hydrogen Ions | 200 | $1 \times 10^{16}$ | Substantially Transparent | >98% | 10.6 | 2500 |
| 418 | Helium Ions | 200 | $1 \times 10^{16}$ | Substantially Transparent | >98% | 10.6 | 2500 |

TABLE 8-continued

| | | | | | | | |
|---|---|---|---|---|---|---|---|
| 419 | Hydrogen Molecule Ions | 200 | $1 \times 10^{16}$ | Substantially Transparent | >98% | 10.6 | 2500 |
| 420 | Argon Ions | 200 | $1 \times 10^{16}$ | Substantially Transparent | >98% | 10.6 | 2500 |

| | Laser Beam Irradiation Conditions | | | | Time Period for Separation |
|---|---|---|---|---|---|
| Specimen | Pulse Interval (μsec) | Pulse Width (nsec) | Diameter of Condensed Light (um) | Irradiation Fluence (mJ/mm$^2$) | in Air at Room Temperature (Min.) |
| 401-1 | 40 | 10 | 30 | 1410 | 105 |
| 401-2 | 40 | 10 | 30 | 1410 | 78 |
| 402 | 40 | 10 | 30 | 1410 | 70 |
| 403 | 40 | 10 | 30 | 1410 | 61 |
| 404 | 40 | 10 | 30 | 1410 | 90 |
| 405 | 40 | 10 | 70 | 7800 | 64 |
| 406 | 40 | 10 | 70 | 7800 | 53 |
| 407 | 40 | 10 | 70 | 7800 | 49 |
| 408 | 40 | 10 | 70 | 7800 | 70 |
| 409 | 40 | 10 | 300 | 2830 | 33 |
| 410 | 40 | 10 | 300 | 2830 | 27 |
| 411 | 40 | 10 | 300 | 2830 | 21 |
| 412 | 40 | 10 | 300 | 2830 | 35 |
| 413 | 40 | 10 | 30 | 7070 | 70 |
| 414 | 40 | 10 | 30 | 7070 | 63 |
| 415 | 40 | 10 | 30 | 7070 | 57 |
| 416 | 40 | 10 | 30 | 7070 | 74 |
| 417 | 3000 | 50 | 550 | 10520 | 24 |
| 418 | 3000 | 50 | 550 | 10520 | 19 |
| 419 | 3000 | 50 | 550 | 10520 | 17 |
| 420 | 3000 | 50 | 550 | 10520 | 28 |

(Evaluation)

Obtained seed substrate 1b and semiconductor substrate 5 including seed substrate 1a and semiconductor layer 3 were evaluated under the criteria the same as in Example 1.

(Results)

Among specimens 101-1 and 101-2 in which semiconductor layer 3 was composed of gallium nitride, specimens in which laser was emitted in air at a room temperature were determined as B and specimens in which laser was emitted in cooled air, in pure water, and in the oil were determined as A.

Among specimens 201-1 and 201-2 in which semiconductor layer 3 was composed of aluminum nitride, specimens in which laser was emitted in air at a room temperature were determined as B and specimens in which laser was emitted in cooled air, in pure water, and in the oil were determined as A.

Among specimens 301-1 and 301-2 in which semiconductor layer 3 was composed of zinc selenide, specimens in which laser was emitted in air at a room temperature were determined as C, specimens in which laser was emitted in cooled air were determined as B, and specimens in which laser was emitted in pure water and in the oil were determined as A.

Among specimens 401-1 and 401-2 in which semiconductor layer 3 was composed of silicon carbide, specimens in which laser was emitted in air at a room temperature were determined as B and specimens in which laser was emitted in cooled air, in pure water, and in the oil were determined as A.

Tables 9 to 12 summarize results.

TABLE 9

| | | Specimen | | | | | | | | | |
|---|---|---|---|---|---|---|---|---|---|---|---|
| | | 101-1 | 101-2 | 102 | 103 | 104 | 105 | 106 | 107 | 108 | 109 | 110 |
| Laser Irradiation Environment | Air at Room Temperature (25° C.) | B | B | A | B | A | B | B | B | A | B | A |
| | Cooled Air (−5° C.) | A | A | A | A | A | B | A | B | A | A | A |
| | Pure Water (25° C.) | A | A | A | A | A | A | A | A | A | A | A |
| | Engine Oil (25° C.) | A | A | A | A | A | A | A | A | A | A | A |

| | | Specimen | | | | | | | | | |
|---|---|---|---|---|---|---|---|---|---|---|---|
| | | 111 | 112 | 113 | 114 | 115 | 116 | 117 | 118 | 119 | 120 |
| Laser Irradiation Environment | Air at Room Temperature (25° C.) | B | A | B | A | B | A | B | A | B | A |

TABLE 9-continued

|  |  |  |  |  |  |  |  |  |  |  |
|---|---|---|---|---|---|---|---|---|---|---|
|  | Cooled Air (−5° C.) | A | A | A | A | A | A | A | A | A | A |
|  | Pure Water (25° C.) | A | A | A | A | A | A | A | A | A | A |
|  | Engine Oil (25° C.) | A | A | A | A | A | A | A | A | A | A |

TABLE 10

|  |  | Specimen | | | | | | | | | |
|---|---|---|---|---|---|---|---|---|---|---|---|
|  |  | 201-1 | 201-2 | 202 | 203 | 204 | 205 | 206 | 207 | 208 | 209 | 210 |
| Laser Irradiation Enviromnent | Air at Room Temperature (25° C.) | B | B | A | A | A | B | B | B | A | B | A |
|  | Cooled Air (−5° C.) | A | A | A | A | A | B | A | A | A | A | A |
|  | Pure Water (25° C.) | A | A | A | A | A | A | A | A | A | A | A |
|  | Engine Oil (25° C.) | A | A | A | A | A | A | A | A | A | A | A |

|  |  | Specimen | | | | | | | | | |
|---|---|---|---|---|---|---|---|---|---|---|---|
|  |  | 211 | 212 | 213 | 214 | 215 | 216 | 217 | 218 | 219 | 220 |
| Laser Irradiation Enviromnent | Air at Room Temperature (25° C.) | A | A | B | A | A | A | B | A | A | A |
|  | Cooled Air (−5° C.) | A | A | A | A | A | A | A | A | A | A |
|  | Pure Water (25° C.) | A | A | A | A | A | A | A | A | A | A |
|  | Engine Oil (25° C.) | A | A | A | A | A | A | A | A | A | A |

TABLE 11

|  |  | Specimen | | | | | | | | | |
|---|---|---|---|---|---|---|---|---|---|---|---|
|  |  | 301-1 | 301-2 | 302 | 303 | 304 | 305 | 306 | 307 | 308 | 309 | 310 |
| Laser Irradiation Environment | Air at Room Temperature (25° C.) | C | C | B | C | B | C | B | C | B | C | B |
|  | Cooled Air (−5° C.) | B | B | A | B | A | B | A | B | A | B | A |
|  | Pure Water (25° C.) | A | A | A | A | A | A | A | A | A | A | A |
|  | Engine Oil (25° C.) | A | A | A | A | A | A | A | A | A | A | A |

|  |  | Specimen | | | | | | | | | |
|---|---|---|---|---|---|---|---|---|---|---|---|
|  |  | 311 | 312 | 313 | 314 | 315 | 316 | 317 | 318 | 319 | 320 |
| Laser Irradiation Environment | Air at Room Temperature (25° C.) | C | B | C | B | C | B | B | A | B | A |
|  | Cooled Air (−5° C.) | B | A | B | A | B | A | A | A | A | A |
|  | Pure Water (25° C.) | A | A | A | A | A | A | A | A | A | A |
|  | Engine Oil (25° C.) | A | A | A | A | A | A | A | A | A | A |

TABLE 12

| | | Specimen | | | | | | | | | | |
|---|---|---|---|---|---|---|---|---|---|---|---|---|
| | | 401-1 | 401-2 | 402 | 403 | 404 | 405 | 406 | 407 | 408 | 409 | 410 |
| Laser Irradiation Environment | Air at Room Temperature (25° C.) | B | B | A | B | A | B | B | B | B | B | A |
| | Cooled Air (−5° C.) | A | A | A | A | A | A | A | A | A | A | A |
| | Pure Water (25° C.) | A | A | A | A | A | A | A | A | A | A | A |
| | Engine Oil (25° C.) | A | A | A | A | A | A | A | A | A | A | A |

| | | Specimen | | | | | | | | | |
|---|---|---|---|---|---|---|---|---|---|---|---|
| | | 411 | 412 | 413 | 414 | 415 | 416 | 417 | 418 | 419 | 420 |
| Laser Irradiation Environment | Air at Room Temperature (25° C.) | B | A | B | A | B | A | A | A | A | A |
| | Cooled Air (−5° C.) | A | A | A | A | A | A | A | A | A | A |
| | Pure Water (25° C.) | A | A | A | A | A | A | A | A | A | A |
| | Engine Oil (25° C.) | A | A | A | A | A | A | A | A | A | A |

The separated front surface of the sample determined as A was observed with SIMS. Then, hydrogen element in an amount clearly greater than in a bulk could be confirmed. At the separated front surface of the sample determined as B, hydrogen element in an amount greater than in a bulk could be confirmed in observation with SIMS. The front surface was further analyzed with XPS. Then, presence of a main element in a state of bonding different from the state of bonding in the semiconductor substrate could be confirmed. Specifically, Ga element in the case of the GaN substrate, Al element in the case of the AlN substrate, Zn element in the case of ZnSe, and Si element in the case of the SiC substrate each in a state of bonding different from the state of bonding in the substrate could be confirmed. At the separated front surface of the sample determined as C, hydrogen element in an amount greater than in a bulk could be confirmed with SIMS. A main element in a state of bonding different from the state of bonding in the semiconductor substrate could be confirmed in analysis with XPS. When surface roughness was evaluated with a three-dimensional profiler, a substantially circular pattern of a recess having a diameter not smaller than 30 μm could also be confirmed.

Specimens under the conditions the same as those for specimen 101-1, specimen 101-2, specimen 201-1, specimen 201-2, specimen 301-1, specimen 301-2, specimen 401-1, and specimen 401-2 were irradiated in pure water at a room temperature with laser beams at pulse widths of 0.02 psec., 1 psec., and 10 psec., a pulse interval of 1 msec. (repetition frequency of 1 kHz), and pulse energy of 0.008 μJ, 0.02 μJ, and 0.05 μJ. Results of determination were the same for all specimens. Under the condition of 0.02 psec. and the condition of 1 psec., determination as C was made in evaluation described previously, and under the condition of 10 psec., determination as B was made. Energy for cutting bond was high and therefore it was difficult to obtain determination A. Even under such conditions for irradiation with laser beams, the diamond layer could be separated from the seed substrate.

[Specimen 102 to Specimen 120]

In specimen 102 to specimen 120, the substrate and the semiconductor layer were separated from each other with the method the same as that for specimen 101-1, except that a type of implanted ions in ion implantation, a dose for the ion implanted layer, and conditions for irradiation with laser beams were set as shown in Table 5. In specimen 111, the side of the main surface of the substrate was irradiated with laser beams instead of the side of the main surface of the semiconductor layer.

[Specimen 202 to Specimen 220]

(Fabrication of Specimen)

In specimen 202 to specimen 220, the substrate and the semiconductor layer were separated from each other with the method the same as that for specimen 201-1, except that a type of implanted ions in ion implantation, a dose for the ion implanted layer, and conditions for irradiation with laser beams were set as shown in Table 6. In specimen 211, the side of the main surface of the substrate was irradiated with laser beams instead of the side of the main surface of the semiconductor layer.

[Specimen 302 to Specimen 320]

In specimen 302 to specimen 320, the substrate and the semiconductor layer were separated from each other with the method the same as that for specimen 301-1, except that a type of implanted ions in ion implantation, a dose for the ion implanted layer, and conditions for irradiation with laser beams were set as shown in Table 7. In specimen 311, the side of the main surface of the substrate was irradiated with laser beams instead of the side of the main surface of the semiconductor layer.

[Specimen 102 to Specimen 120]

In specimen 402 to specimen 420, the substrate and the semiconductor layer were separated from each other with the method the same as that for specimen 401-1, except that a type of implanted ions in ion implantation, a dose for the ion implanted layer, and conditions for irradiation with laser beams were set as shown in Table 8. In specimen 411, the side of the main surface of the substrate was irradiated with laser beams instead of the side of the main surface of the semiconductor layer.

(Evaluation)

Obtained seed substrate 1b and semiconductor substrate 5 including seed substrate 1a and semiconductor layer 3 were evaluated under the criteria the same as in Example 1.

(Results)

Among specimens 102 to 120 in which semiconductor layer 3 was composed of gallium nitride, specimens in which laser was emitted in air at a room temperature or in cooled air were determined as A or B and specimens in which laser was emitted in pure water and in the oil were determined as A.

Among specimens 202 to 220 in which semiconductor layer 3 was composed of aluminum nitride, specimens in which laser was emitted in air at a room temperature or in cooled air were determined as A or B and specimens in which laser was emitted in pure water and in the oil were determined as A.

Among specimens 302 to 320 in which semiconductor layer 3 was composed of zinc selenide, specimens in which laser was emitted in air at a room temperature were determined as B or C, specimens in which laser was emitted in cooled air were determined as A or B, and specimens in which laser was emitted in pure water and in the oil were determined as A.

Among specimens 402 and 420 in which semiconductor layer 3 was composed of silicon carbide, specimens in which laser was emitted in air at a room temperature were determined as A or B and specimens in which laser was emitted in cooled air, in pure water, and in the oil were determined as A.

The separated front surface of the sample determined as A was observed with SIMS. Then, an implanted element in an amount clearly greater than in a bulk could be confirmed. At the separated front surface of the sample determined as B, an implanted element in an amount greater than in a bulk could be confirmed in observation with SIMS. The front surface was further analyzed with XPS. Then, presence of a main element in a state of bonding different from the state of bonding in the semiconductor substrate could be confirmed. Specifically, Ga element in the case of the GaN substrate, Al element in the case of the AlN substrate, Zn element in the case of ZnSe, and Si element in the case of the SiC substrate each in a state of bonding different from the state of bonding in the substrate could be confirmed. At the separated front surface of the sample determined as C, an implanted element in an amount greater than in a bulk could be confirmed with SIMS. A main element in a state of bonding different from the state of bonding in the semiconductor substrate could be confirmed in analysis with XPS. When surface roughness was evaluated with a three-dimensional profiler, a substantially circular pattern of a recess having a diameter not smaller than 30 µm could also be confirmed.

Example 4

In Example 4, the method for manufacturing a semiconductor substrate according to the fourth embodiment was reviewed. Specifically, in the present example, combined semiconductor substrate 36 and seed substrate 31b were separated from each other with the method the same as in Example 3 except that first substrate 35 composed of $SiO_2$ was bonded to seed substrate 31 after ion implantation into the seed substrate instead of forming a semiconductor layer in the process for manufacturing specimens 101 to 120 in Example 3. Evaluation of the separation plane exhibited the tendency substantially matching with Table 9 for Example 3, although roughness of the front surface was slightly greater in some specimens.

First substrate 35 composed of $SiO_2$ could readily be formed to a thickness not smaller than 0.3 mm in combined semiconductor substrate 36. Therefore, even though the semiconductor substrate had a small thickness, it did not fracture and a readily portable substrate could be obtained.

Example 5

In Example 5, the method for manufacturing a semiconductor substrate according to the fourth embodiment was reviewed. Specifically, in the present example, combined semiconductor substrate 36 and seed substrate 31b were separated from each other with the method the same as in Example 1 except that first substrate 35 composed of $SiO_2$ was bonded to seed substrate 31 after ion implantation into the seed substrate instead of forming a diamond layer in the process for manufacturing specimens 1 to 35 in Example 1. Evaluation of the separation plane exhibited the tendency substantially matching with Table 2 for Example 1, although roughness of the front surface was slightly greater in some specimens.

First substrate 35 composed of $SiO_2$ could readily be formed to a thickness not smaller than 0.3 mm in combined semiconductor substrate 36. Therefore, even though the semiconductor substrate had a small thickness, it did not fracture and a readily portable substrate could be obtained.

Example 6

In Example 6, a semiconductor-joined substrate in the sixth embodiment was fabricated as below. A seed substrate was prepared with the manufacturing method the same as that for specimen 1-1 and specimen 1-2 used in Example 1, an ion implanted layer was formed, and thereafter a diamond layer (semiconductor layer) was formed. Then, a growth surface was polished to be flat so as to achieve Ra not greater than 0.1 µm without separating the semiconductor substrate. A semiconductor-joined substrate was thus obtained. When Ra was not greater than 1 µm, polishing was not necessary. A substrate fabricated under conditions the same as those for specimen 1 had a thickness of a semiconductor layer of 150 µm, and a substrate fabricated under conditions the same as those for specimen 1-2 had a thickness of a semiconductor layer of 50 µm. A substrate provided with an ion implanted layer and planarized to satisfy appropriate conditions was the semiconductor-joined substrate. The semiconductor-joined substrate was joined with AuSn solder to a circuit substrate (a bare substrate of a semiconductor) where an electronic circuit had been formed. Thereafter, as in Example 1, laser beams were emitted in cooled air for separation from the seed substrate, and a thin diamond layer was bonded to the circuit substrate. Thereafter, a bare GaN chip (a laser diode chip) was bonded onto the thin diamond layer with thin Sn being interposed at a room temperature under the principles of friction making use of ultrasonic oscillation, and the laser diode was wired and operated. Based on comparison of output from the laser diode between presence and absence of the diamond layer, output higher by 20 to 30% could be obtained in the presence of the diamond layer.

Example 7

In Example 7, a semiconductor-joined substrate in the sixth embodiment was fabricated as below. A seed substrate was prepared with the manufacturing method the same as that for specimen 101-1 and specimen 101-2 used in Example 3, an ion implanted layer was formed, and thereafter a diamond layer (semiconductor layer) was formed.

Then, a semiconductor-joined substrate was obtained through planarization as a semiconductor substrate without separating the semiconductor substrate. An LED element was fabricated on the semiconductor-joined substrate by forming a necessary epitaxial layer, SiO$_2$ was formed thereon as a cap layer, and that surface was polished to be flat so as to achieve Ra not greater than 10 nm. The process so far was performed on a 2-inch wafer. Thereafter, the wafer was cut into 3-mm squares, and a semiconductor-joined substrate with the LED was bonded and joined to a circuit substrate (a bare substrate composed of an Si semiconductor) where a flat SiO$_2$ layer was provided. Thereafter, as in Example 1, laser beams were emitted in cooled air for separation from the seed substrate, and a circuit substrate on which only a thin semiconductor layer remained was fabricated. Thereafter, the circuit substrate was wired to a laser diode and it successfully operated. In the present example, a hybrid electronic circuit could be fabricated.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The semiconductor substrate and the combined semiconductor substrate in the present invention are useful for use in tools such as cutting tools, grinding tools, and wear-resistant tools, various products such as optical components, semiconductors, and electronic components, substrates for blue LEDs and white LEDs, substrates for high-efficiency switching devices, substrates for power control or for high-efficiency power devices mounted on cars, optical substrates, and optical lenses.

REFERENCE SIGNS LIST 1, 21, 31, 41 seed substrate; 1a, 1b, 21a, 21b, 31a, 31b, 41a, 41b part of seed substrate; 2, 22, 32 ion implanted layer; 3, 23 semiconductor layer; 4, 24, 34, 44 light; 5 semiconductor substrate; 25, 35 first substrate; and 26, 36 combined semiconductor substrate

The invention claimed is:

1. A method for manufacturing a semiconductor substrate comprising:
   preparing a seed substrate containing a semiconductor material;
   forming an ion implanted layer at a certain depth from a front surface of a main surface of the seed substrate by implanting ions into the seed substrate;
   growing a semiconductor layer on the main surface of the seed substrate with a vapor-phase synthesis method; and
   separating a semiconductor substrate including the semiconductor layer and a part of the seed substrate by irradiating the front surface of the main surface of at least any of the semiconductor layer and the seed substrate with light, wherein
   the semiconductor layer is a homo epitaxial growth layer.

2. The method for manufacturing a semiconductor substrate according to claim 1, wherein
   the ion implanted layer has a thickness not smaller than 50 nm and not greater than 10 μm, and
   a dose of ions is within a range not less than 1×10$^{14}$ cm$^{-2}$ and not more than 2×10$^{18}$ cm$^{-2}$.

3. The method for manufacturing a semiconductor substrate according to claim 1, wherein
   the ions including at least one element selected from the group consisting of hydrogen, oxygen, nitrogen, carbon, helium, neon, and argon are implanted.

4. The method for manufacturing a semiconductor substrate according to claim 1, wherein
   the light is pulsed light, and irradiation fluence per pulse at the front surface of the main surface irradiated with the light is not lower than 0.01 J/mm$^2$ and not higher than 1500 J/mm$^2$.

5. The method for manufacturing a semiconductor substrate according to claim 1, wherein
   the light is pulsed light, and pulse energy at the front surface of the main surface irradiated with the light is not lower than 0.05 mJ and not higher than 1000 mJ.

6. The method for manufacturing a semiconductor substrate according to claim 1, wherein
   the light is laser beams and scans the front surface of the main surface irradiated with the light.

7. The method for manufacturing a semiconductor substrate according to claim 1, wherein
   the separating a semiconductor substrate is performed in a liquid.

8. The method for manufacturing a semiconductor substrate according to claim 1, wherein
   the semiconductor layer contains at least one selected from the group consisting of diamond, aluminum nitride, gallium nitride, silicon carbide, zinc selenide, and zinc sulfide.

* * * * *